(12) United States Patent
Walters et al.

(10) Patent No.: US 10,496,862 B1
(45) Date of Patent: *Dec. 3, 2019

(54) DETECTION OF IMAGES IN RELATION TO TARGETS BASED ON COLORSPACE TRANSFORMATION TECHNIQUES AND UTILIZING ULTRAVIOLET LIGHT

(71) Applicant: Capital One Services, LLC, McLean, VA (US)

(72) Inventors: Austin Grant Walters, Savoy, IL (US); Jeremy Edward Goodsitt, Champaign, IL (US); Fardin Abdi Taghi Abad, Champaign, IL (US)

(73) Assignee: CAPITAL ONE SERVICES, LLC, McLean, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/357,211

(22) Filed: Mar. 18, 2019

(51) Int. Cl.
*G06K 19/06* (2006.01)
*G06K 9/46* (2006.01)
(Continued)

(52) U.S. Cl.
CPC ....... *G06K 7/10821* (2013.01); *G06F 9/3004* (2013.01); *G06K 9/4642* (2013.01);
(Continued)

(58) Field of Classification Search
CPC ..... G06K 19/0614; G06K 2019/06225; G06K 19/06037; G06K 9/4642; G06K 9/4652;
(Continued)

(56) References Cited

U.S. PATENT DOCUMENTS

| 5,678,033 A | 10/1997 | Moledina et al. |
| 5,724,450 A | 3/1998 | Chen et al. |

(Continued)

FOREIGN PATENT DOCUMENTS

| CN | 104899630 A | 9/2015 |
| CN | 106447590 A | 2/2017 |

(Continued)

OTHER PUBLICATIONS

Walters, Austin G., "Edge Detection in Computer Vision," Metacortex Inc. [online] Feb. 17, 2015 [retrieved on Mar. 18, 2019]. Retrieved from Internet URL: https://austingwalters.com/edge-detection-in-computer-vision/, 22 pages.

(Continued)

*Primary Examiner* — Suezu Ellis

(57) ABSTRACT

Techniques to improve detection and security of images, including formation and detection of matrix-based images. Some techniques include logic to process image data, generate one or more colorspaces associated with that data, and perform colorspace conversions based on the generated colorspace. The logic may be further configured to generate an image based on the colorspace conversions, including but not limited to a matrix bar code. The logic may be further configured to apply one or both of an ultraviolet layer and an infrared layer to the image, e.g. matrix barcode, generated from the colorspace conversion(s). Other embodiments are described and claimed.

7 Claims, 16 Drawing Sheets

(51) Int. Cl.
  *G06T 7/90* (2017.01)
  *G06T 5/40* (2006.01)
  *G06K 7/10* (2006.01)
  *H03K 19/177* (2006.01)
  *G06F 9/30* (2018.01)

(52) U.S. Cl.
  CPC ........... *G06K 9/4652* (2013.01); *G06K 19/06* (2013.01); *G06K 19/0614* (2013.01); *G06K 19/06037* (2013.01); *G06T 5/40* (2013.01); *G06T 7/90* (2017.01); *H03K 19/1776* (2013.01); *G06K 2019/06225* (2013.01)

(58) Field of Classification Search
  CPC  B42D 25/382; B42D 25/387; B42D 2033/20; B42D 2035/24; G06T 7/90; G06T 5/40; G06T 2207/10024
  See application file for complete search history.

(56) References Cited

U.S. PATENT DOCUMENTS

| | | | |
|---|---|---|---|
| 6,711,291 | B1 | 3/2004 | Stubler et al. |
| 6,831,682 | B1 | 12/2004 | Silverbrook et al. |
| 7,273,175 | B2 | 9/2007 | Zhao et al. |
| 8,405,780 | B1 | 3/2013 | Schaem |
| 9,805,296 | B2 | 10/2017 | Loy et al. |
| 2002/0126328 | A1 | 9/2002 | Lehmeier et al. |
| 2003/0053706 | A1 | 3/2003 | Hong et al. |
| 2004/0197021 | A1 | 10/2004 | Huang et al. |
| 2005/0006472 | A1 | 1/2005 | Verschuur et al. |
| 2007/0046956 | A1 | 3/2007 | Burlingame |
| 2007/0084933 | A1* | 4/2007 | Zhang ................... G06K 7/0004 235/487 |
| 2007/0229531 | A1 | 10/2007 | Park et al. |
| 2008/0261687 | A1 | 10/2008 | Gatzios |
| 2008/0284793 | A1 | 11/2008 | Young |
| 2009/0028382 | A1 | 1/2009 | Erol |
| 2010/0034380 | A1 | 2/2010 | Lee |
| 2011/0186625 | A1 | 8/2011 | Mangione-Smith |
| 2011/0233284 | A1 | 9/2011 | Howard |
| 2012/0075484 | A1 | 3/2012 | Kawamoto et al. |
| 2012/0176409 | A1 | 7/2012 | Noge |
| 2012/0329553 | A1 | 12/2012 | Gagner et al. |
| 2013/0026241 | A1 | 1/2013 | Sakahashi et al. |
| 2013/0343645 | A1 | 12/2013 | Dalal et al. |
| 2014/0119645 | A1 | 5/2014 | Zimet-Rubner et al. |
| 2014/0119647 | A1 | 5/2014 | Cheong et al. |
| 2015/0104184 | A1 | 4/2015 | Jeffrey |
| 2015/0243200 | A1 | 8/2015 | Pan |
| 2015/0294460 | A1* | 10/2015 | Satish ................... G06T 7/0012 382/128 |
| 2017/0061584 | A1 | 3/2017 | Lim et al. |
| 2017/0076127 | A1 | 3/2017 | Arce et al. |
| 2017/0309104 | A1 | 10/2017 | Lewis et al. |
| 2017/0316297 | A1 | 11/2017 | Lee |
| 2019/0066338 | A1* | 2/2019 | Perlman ................ G06K 7/1408 |
| 2019/0122440 | A1 | 4/2019 | Barros et al. |

FOREIGN PATENT DOCUMENTS

| | | |
|---|---|---|
| JP | 2012141729 A | 7/2012 |
| JP | 2012181591 A | 9/2012 |
| KR | 101445502 B1 | 9/2014 |
| KR | 101573655 B1 | 12/2015 |
| KR | 20170038468 A | 4/2017 |
| WO | 2016111823 A2 | 7/2016 |
| WO | 2016170041 A1 | 10/2016 |

OTHER PUBLICATIONS

Walters, Austin G., "ChromaTags: An Accurate, Robust, and Fast Visual Fiducial System" [online] May 15, 2015 [retrieved on Mar. 18, 2019]. Retrieved from Internet URL: https://austingwalters.com/chromatags/, 13 pages.

Author Unknown., "ChromaTags", GitHub [online] 2018 [retrieved on Mar. 18, 2019]. Retrieved from Internet URL: https://github.com/lettergram/chromatag, 3 pages.

Author Unknown., "ChromaTag: A Colored Marker and Fast Detection Algorithm", GitHub [online] 2018 [retrieved on Mar. 18, 2019]. Retrieved from Internet URL: https://github.com/CogChameleon/ChromaTag, 3 pages.

Author Unknown., "H.264 is Magic", SidBala [online] Nov. 2, 2016 [retrieved on Mar. 18, 2019]. Retrieved from Internet URL: https://sidbala.com/h-264-is-magic/, 20 pages.

DeGol et al., "Chroma Tag: A Colored Marker and Fast Detection Algorithm", 2017 IEEE International Conference on Computer Vision, pp. 1481-1490, IEEE Computer Society, 2017.

\* cited by examiner

500A

```
┌─────────────────────────────────────┐
│  RECEIVE A REPRESENTATIVE DATASET OF │
│             A TARGET                 │
│               502                    │
└─────────────────────────────────────┘
                  │
                  ▼
┌─────────────────────────────────────┐
│  PROCESS THE REPRESENTATIVE DATASET  │
│           INTO A HISTOGRAM           │
│               504                    │
└─────────────────────────────────────┘
                  │
                  ▼
┌─────────────────────────────────────┐
│   IDENTIFY A MOST PREVALENT PLURALITY│
│  OF COLORS ASSOCIATED WITH THE TARGET│
│         BASED ON THE HISTOGRAM       │
│               506                    │
└─────────────────────────────────────┘
                  │
                  ▼
┌─────────────────────────────────────┐
│ DETERMINE A RELATED PLURALITY OF COLORS│
│ BASED ON THE HISTOGRAM, INCLUDING AT LEAST│
│ ONE OF I) AN ABSENT COLOR IN RELATION TO THE│
│ TARGET AND II) AT LEAST ONE LEAST PREVALENT│
│     COLOR ASSOCIATED WITH THE TARGET │
│               508                    │
└─────────────────────────────────────┘
                  │
                  ▼
┌─────────────────────────────────────┐
│ CREATE A MATRIX USING THE RELATED    │
│        PLURALITY OF COLORS           │
│               510                    │
└─────────────────────────────────────┘
```

DETECTING A MATRIX ON DISPLAY VIA A PHYSICAL MEDIUM AND ASSOCIATED WITH AN ENVIRONMENT, WHERE THE MATRIX INCLUDES A PLURALITY OF NON-BLACK AND NON-WHITE COLORS, WHERE EACH ONE OF THE PLURALITY OF NON-BLACK AND NON-WHITE COLORS ARE AT LEAST ONE OF I) AN ABSENT COLOR IN RELATION TO THE ENVIRONMENT AND II) AT LEAST ONE LEAST PREVALENT COLOR ASSOCIATED WITH THE ENVIRONMENT
*515*

TRANSMIT A RESULT OF THE DETECTION TO A COMPUTING DEVICE
*520*

DETECTING A MATRIX ON DISPLAY VIA A PHYSICAL MEDIUM AND ASSOCIATED WITH AN ENVIRONMENT, WHERE THE MATRIX INCLUDES A PLURALITY OF NON-BLACK AND NON-WHITE COLORS AND AT LEAST ONE OF AN ULTRAVIOLET LAYER AND AN INFRARED LAYER, WHERE EACH ONE OF THE PLURALITY OF NON-BLACK AND NON-WHITE COLORS ARE AT LEAST ONE OF I) AN ABSENT COLOR IN RELATION TO THE ENVIRONMENT AND II) AT LEAST ONE LEAST PREVALENT COLOR ASSOCIATED WITH THE ENVIRONMENT
*540*

TRANSMIT A RESULT OF THE DETECTION TO A COMPUTING DEVICE
*550*

*FIG. 5D*

MATRIX CODE(S) 600A

DETECTION OF IMAGES IN RELATION TO TARGETS BASED ON COLORSPACE TRANSFORMATION TECHNIQUES AND UTILIZING ULTRAVIOLET LIGHT

BACKGROUND

Since time immemorial, certain materials (e.g., paint, ink, and/or the like) have been used to memorialize scenes and/or objects into semi-permanent to permanent mediums. Such memorialization includes efforts in photography to create photos. Computer technologies allow for digitization and detections of these photos into images and have introduced image processing as a technical field. Edge detection constitutes at least one aspect of image processing and has applications in a number of cases.

It is with respect to these and other considerations that the present improvements have been needed.

SUMMARY

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

One aspect of the present disclosure includes an apparatus for creating a matrix optimized for detection in a particular environment. The apparatus includes: a memory to store instructions, and processing circuitry, coupled with the memory, operable to execute the instructions, that when executed, cause the processing circuitry to: receive a representative dataset containing at least one of i) one or more images of a target and ii) one or more videos of the target, the target including at least one of i) an environment, ii) a live entity and iii) an object, process the representative dataset to create a histogram of the target, identify a most prevalent plurality of colors associated with the target based on the histogram, determine a related plurality of colors based on the histogram, where the related plurality of colors include at least one of i) an absent color in relation to the target and ii) a least prevalent color associated with the target, and create a matrix using the related plurality of colors, where the matrix is associated with the target.

Another aspect of the present disclosure includes a method for detecting a matrix optimized for detection in a particular environment. The method includes: detecting a matrix on display via a physical medium and associated with an environment, where the matrix includes a plurality of non-black and non-white colors, where each one of the plurality of non-black and non-white colors are at least one of i) an absent color in relation to the environment and ii) a least prevalent color associated with the environment.

Yet another aspect of the present disclosure includes an article of manufacture that displays a matrix barcode optimized for detection in a particular environment. The article of manufacture includes: a matrix barcode on display via a physical medium and associated with an environment, where the matrix barcode includes a plurality of non-black and non-white colors, where the matrix barcode is embedded with computer data, where the computer data is represented by a plurality of pixels associated with non-black and non-white colors, and where the plurality of pixels are associated with at least 3 color-channels forming the matrix barcode.

Yet another aspect of the present disclosure includes an apparatus for creating a matrix optimized for detection in a particular environment, where the matrix is part of a layered image that includes an ultraviolet layer. The apparatus includes: receive a representative dataset containing at least one of i) one or more images and ii) one or more videos of a target, the target including at least one of i) an environment, ii) a live entity and iii) an object, process the representative dataset to create a histogram of the target, identify a most prevalent plurality of colors associated with the target based on the histogram, determine a related plurality of colors based on the histogram, where the related plurality of colors include at least one of i) an absent color in relation to the target and ii) a least prevalent color associated with the target, and create a matrix using the related plurality of colors and at least one ultraviolet layer, where the matrix is associated with the target.

Yet another aspect of the present disclosure includes a method for detecting a matrix optimized for detection in a particular environment, where the matrix is part of an image that includes at least one ultraviolet layer. The method includes: detecting a matrix barcode on display via a physical medium and associated with an environment, where the matrix barcode includes a plurality of non-black and non-white colors and at least one ultraviolet layer, where the at least one ultraviolet layer reflects ultraviolet light, and where the matrix barcode includes four or more bits of information.

Yet another aspect of the present disclosure includes an article of manufacture that displays a matrix barcode optimized for detection in a particular environment, where the matrix barcode is part of an image with an ultraviolet layer. The article of manufacture includes: a matrix barcode on display via a suitable surface for at least one of: projecting, absorbing, reflecting, or illuminating ultraviolet light, where the matrix barcode includes a combination of four or more constituent matrix barcodes each associated with a distinct color-channel, including an ultraviolet color-channel associated with at least one layer of at least one of the four constituent matrix barcodes.

Yet another aspect of the present disclosure includes an apparatus for creating a matrix optimized for detection in a particular environment, where the matrix is part of a layered image that includes an infrared layer. The apparatus includes: receive a representative dataset containing at least one of i) one or more images and ii) one or more videos of a target, the target including at least one of i) an environment, ii) a live entity and iii) an object, process the representative dataset to create a histogram of the target, identify a most prevalent plurality of colors associated with the target based on the histogram, determine a related plurality of colors based on the histogram, where the related plurality of colors include at least one of i) an absent color in relation to the target and ii) a least prevalent color associated with the target, and create a matrix using the related plurality of colors and at least one infrared layer, where the matrix is associated with the target.

Yet another aspect of the present disclosure includes a method for detecting a matrix optimized for detection in a particular environment, where the matrix is part of an image that includes at least one infrared layer. The method includes: detecting a matrix barcode on display via a physical medium and associated with an environment, where the matrix barcode includes a plurality of non-black and non-white colors and at least one infrared layer, where the at least one infrared layer reflects infrared light, and where the matrix barcode includes four or more bits of information.

Yet another aspect of the present disclosure includes an article of manufacture that displays a matrix barcode optimized for detection in a particular environment, where the matrix barcode is part of an image with an infrared layer. The article of manufacture includes: a matrix barcode on display via a suitable surface for at least one of: projecting, absorbing, reflecting, or illuminating infrared light, where the matrix barcode includes a combination of four or more constituent matrix barcodes each associated with a distinct color-channel, including an infrared color-channel associated with at least one layer of at least one of the four constituent matrix barcodes.

Yet another aspect of the present disclosure includes an apparatus for creating a matrix barcode that contains both an ultraviolet layer and an infrared layer. The apparatus includes: a memory to store instructions, and processing circuitry, coupled with the memory, operable to execute the instructions, that when executed, cause the processing circuitry to: create a matrix barcode using at least one infrared layer and at least one ultraviolet layer.

Yet another aspect of the present disclosure includes an apparatus for creating a matrix optimized for detection in a particular environment, where the matrix is part of a layered image that includes an infrared layer and an ultraviolet layer. The apparatus includes: a memory to store instructions, and processing circuitry, coupled with the memory, operable to execute the instructions, that when executed, cause the processing circuitry to: create a matrix barcode using one or more color layers, at least one infrared layer and at least one ultraviolet layer, receive a representative dataset containing at least one of i) one or more images and ii) one or more videos of a target, the target including at least one of i) an environment, ii) a live entity and iii) an object, process the representative dataset to create a histogram of the target, identify a most prevalent plurality of colors associated with the target based on the histogram, and determine a related plurality of colors based on the histogram, where the related plurality of colors include at least one of i) an absent color in relation to the target and ii) a least prevalent color associated with the target, where the related plurality of colors are included in each one of the one or more color layers.

Yet another aspect of the present disclosure includes a method for detecting a matrix barcode optimized for detection in a particular environment, where the matrix barcode includes both an ultraviolet layer and an infrared layer. The method includes: detecting a matrix barcode on display via a physical medium and associated with an environment, where the matrix barcode includes a plurality of non-black and non-white colors, at least one infrared layer, and at least one ultraviolet layer, and where the at least one ultraviolet layer reflects ultraviolet light, and where the at least one infrared layer reflects infrared light.

Yet another aspect of the present disclosure includes an article of manufacture for displaying a matrix barcode with both an ultraviolet layer and an infrared layer. The article of manufacture includes: a matrix barcode on display via a suitable surface for at least one of: projecting, absorbing, reflecting, or illuminating both infrared light and ultraviolet light, the matrix barcode including at least one infrared layer and at least one ultraviolet layer.

Yet another aspect of the present disclosure includes an article of manufacture for displaying a matrix barcode with both an ultraviolet layer and an infrared layer, and one or more colored layers optimized for detection in a particular environment. The article of manufacture includes: a matrix barcode on display via a suitable surface reflecting both infrared light and ultraviolet light, the matrix barcode including at least one infrared layer, at least one ultraviolet layer, and a plurality of non-black and non-white colors, and where the plurality of non-black and non-white colors are associated with at least three non-white and non-black color-channels.

To the accomplishment of the foregoing and related ends, certain illustrative aspects are described herein in connection with the following description and the annexed drawings. These aspects are indicative of the various ways in which the principles disclosed herein can be practiced and all aspects and equivalents thereof are intended to be within the scope of the claimed subject matter. Other advantages and novel features may become apparent from the following detailed description when considered in conjunction with the drawings.

BRIEF DESCRIPTION OF THE DRAWINGS

FIG. 5A illustrates an embodiment of a first logic flow for the system of FIG. 1 in accordance with at least one embodiment of the present disclosure.

FIG. 5B illustrates an embodiment of a second logic flow for the system of FIG. 1 and in accordance with at least one embodiment of the present disclosure.

FIG. 5D illustrates an embodiment of a fourth logic flow for the system of FIG. 1 in accordance with at least one embodiment of the present disclosure.

DETAILED DESCRIPTION

Figure 1:
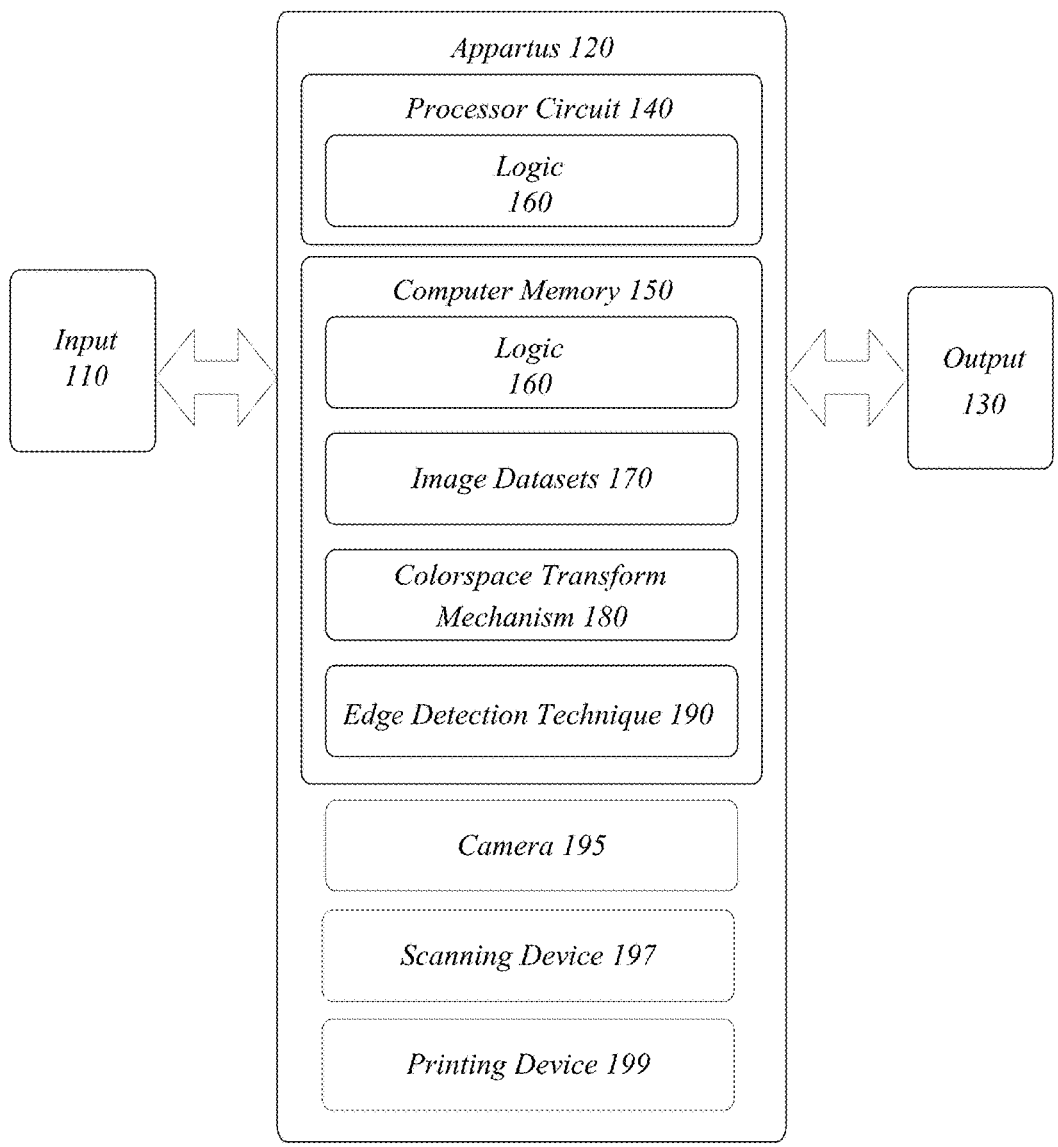
FIG. 1 illustrates an embodiment of a system to improve edge detection in images in accordance with at least one embodiment of the present disclosure.

Various embodiments are directed to improving image processing by identifying which colorspace model is most appropriate to use for detection in a particular environment, e.g., to convert between colorspace(s) to improve detection within particular environments or in association with particular targets. In various embodiments, the conversion between colorspace(s) provides for a matrix located on an object or displayed by an electronic device, where the matrix is optimized for detection in an environment by performing one or more colorspace conversations in generating the matrix. In one or more embodiments, the matrix is a matrix barcode, and in one or more embodiments, the matrix barcode is a fiducial marker.

In various embodiments, the colorspace conversion encodes information with respect to a matrix barcode, which permits proper scanning of the object associated with the matrix barcode, while preventing tampering and false verifications, e.g., the color-channels containing the information are tied to the conversion, and without having a scanning device accessing information related to the conversion, the scan cannot verify the object associated with the object and/or access any information associated therewith.

In various embodiments, a colorspace conversion provides for increasing the amount of information stored on the matrix, e.g., matrix barcode, as the color-channels associated with the converted-to (derivative) colorspace can be increased as needed, without any limitation (provided the scanning equipment is suitably configured to make detections when the matrix is scanned).

In various embodiments, to further increase the information associated with the matrix, add additional layers of security, and/or make optimal use of inks associated with printing the matrix, ultraviolet and/or infrared layers can be used with respect to the matrix.

Accordingly, various embodiments of the present disclosure provide at least one of the following advantages: i) enhancing detection of an image, e.g., matrix, on an object in an environment, (as the matrix colors are selected and optimized with the colors of the environment in mind), ii) providing for a more secure verification, and iii) storing more information on the matrix, as there are no front-loaded limitations on how many color-channels can be employed, and the amount of information can be further increased, and a verification scan made more secure, by adding infrared or ultraviolet features.

In various embodiments, the colorspace conversions improve edge detection. In image processing, edge detection is a known technical field and techniques for edge detection provide different results for different colorspace models. It is not unusual for one colorspace model to provide better results over another colorspace in edge detection because having image data in accordance with the colorspace model has a higher likelihood of success in edge detection than the other colorspace model.

Colorspace models are configured to represent color data, but most models differ in their representation of that color data. For instance, the CIELAB or LAB colorspace model represents color as three values: L for the Luminance/Lightness and Alpha (A) and Beta (B) for the green-red and blue-yellow color components, respectively. The LAB colorspace model is typically used when converting from a Red-Green-Blue (RGB) colorspace model into Cyan-Magenta-Yellow-Black (CMYK). For some images, representing its color data in the LAB colorspace model provides better edge detection results than other colorspace models including the RGB model. As a result, the embodiments can improve affordability, scalability, modularity, extendibility, or interoperability for an operator, device or network that utilizes image detection as a means of verifying a transaction by providing a more effective and accurate manner of scanning an image associated with the verification (and by extension, minimizing redundant consumption of computer resources).

With general reference to notations and nomenclature used herein, the detailed descriptions which follow may be presented in terms of program procedures executed on a computer or network of computers. These procedural descriptions and representations are used by those skilled in the art to most effectively convey the substance of their work to others skilled in the art.

A procedure is here, and generally, conceived to be a self-consistent sequence of operations leading to a desired result. These operations are those requiring physical manipulations of physical quantities. Usually, though not necessarily, these quantities take the form of electrical, magnetic or optical signals capable of being stored, transferred, combined, compared, and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to those quantities.

Further, the manipulations performed are often referred to in terms, such as adding or comparing, which are commonly associated with mental operations performed by a human operator. No such capability of a human operator is necessary, or desirable in most cases, in any of the operations described herein which form part of one or more embodiments. Rather, the operations are machine operations. Useful machines for performing operations of various embodiments include general purpose digital computers or similar devices.

Various embodiments also relate to apparatus or systems for performing these operations. This apparatus may be specially constructed for the required purpose or it may comprise a general purpose computer as selectively activated or reconfigured by a computer program stored in the computer. The procedures presented herein are not inherently related to a particular computer or other apparatus. Various general purpose machines may be used with programs written in accordance with the teachings herein, or it may prove convenient to construct more specialized apparatus to perform the required method steps. The required structure for a variety of these machines may appear from the description given.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form to facilitate a description thereof. The intention is to cover all modifications, equivalents, and alternatives consistent with the claimed subject matter.

FIG. 1 illustrates a block diagram for a system 100. Although the system 100 shown in FIG. 1 has a limited number of elements in a certain topology; it may be appreciated that the system 100 may include more or fewer elements in alternate topologies as desired for a given implementation. The system 100 may implement some or all of the structure and/or operations for the system 100 in a single computing entity, such as entirely within a single device.

The system 100 may comprise an apparatus 120. The apparatus 120 may be generally arranged to process input 110 using various components and generate output 130 of which (some) output 130 is displayed on a display device or printed on a suitable material surface. The apparatus 120 may comprise a processor 140 (e.g., processing circuit) and computer memory 150. The processing circuit 140 may be any type of logic circuit and the computer memory 150 may be a configuration of one or more memory units.

The apparatus 120 further includes logic 160 stored in the computer memory 150 and executed on the processing circuit 140. The logic 160 is operative to cause the processing circuit 140 to process image data of image datasets 170 into patched image data where the image data is being configured in accordance with a colorspace model. The colorspace model as described herein refers to any suitable colorspace model, such as Red-Green-Blue (RGB), Cyan-Magenta-Yellow-Black (CMYK), Luminance-Alpha-Beta (LAB), and/or the like. For example, the Alpha and Beta channels of the LAB colorspace model refer to green-red and blue-yellow color components, respectively. The green-red component may represent a variance between red and green with green in the negative direction, and red in the positive direction along an axis and the blue-yellow component may represent a variance between blue and yellow with blue in the negative direction and yellow in the positive direction along an axis. In various embodiments, an edge may be defined (mathematically) as each pixel location where the Alpha channel has a value of zero (0) or near zero.

In various embodiments, the patched image data includes a plurality of patches of which each patch comprises color data (e.g., pixel data where each pixel is represented as a tuple of Red-Green-Blue (RGB) color intensities). As described herein, one colorspace model (e.g., RGB) may correspond to a higher likelihood of success in edge detection than another colorspace model. Some images provide optimal or near-optimal edge detection results when arranged in RGB while other images provide optimal or near-optimal edge detection results when arranged in LAB or an XYZ colorspace and vice versa.

In various embodiments, the logic 160 is further operative to cause the processing circuit 140 to apply the colorspace transform mechanism 180 to the image data to generate the transformed image data in accordance with the other colorspace model. Then, the logic 160 is operative to cause the processing circuit 140 to apply an edge detection technique 190 to the transformed image data. The edge detection technique 190 is an image processing technique that refers to any one of a number of algorithms for identifying edges or boundaries of objects within images. In general, the edge detection technique 190 provides information (e.g., pixel data) indicating positions of edges in the image data of the image datasets 170. Some implementations of the edge detection technique 190 operate by detecting discontinuities in brightness and, for those implementations, having the image data in a LAB colorspace, or XYZ colorspace over RGB provides more precise edge detection results. Some implementations of the edge detection technique 190 provide accurate edge detection results when the image data is modeled according to HCL (Hue-Chroma-Luminance) instead of RGB.

In various embodiments, the logic 160 is further operative to cause the processing circuit 140 to identify an image group corresponding to the patched image data. The image datasets 170 further includes image group model data correlating images with a colorspace model most likely to provide appropriate edge detection results. In various embodiments, the image group model data indicates which colorspace model to use in transforming a given image prior to edge detection to achieve near-optimal edge detection results. The logic 160 is further configured to cause the processing circuit 140 to select a colorspace transform mechanism 180 based upon the image group. The colorspace transform mechanism 180 is operative to transform the image data into transformed image data in accordance with another colorspace model, the other colorspace model having a higher likelihood than the colorspace model at edge detection for the image group. It is appreciated that the other colorspace model may be any colorspace model including those with a different number of channels than the colorspace model.

In various embodiments, the logic 160 can be further operative to cause the processing circuit 140 to determine a colorspace that is optimal for detection in association with a particular object, entity, or environment, where a colorspace or histogram representation of the particular object, entity or environment can be part of the image datasets 170. The logic 160 can be further operative to cause the processing circuit 140 to determine the optimal colorspace based on one or more colorspace conversion operations, where the colorspace conversion operations can provide a mechanism for encoding information in any suitable medium, including but not limited to a matrix, such as a matrix barcode, a fiducial marker, any other suitable barcode, or any other suitable image. The logic 160 can be further operative to cause the processing circuit 140 to generate a scheme for a matrix, e.g., a matrix barcode, fiducial marker, etc. based on the colorspace determination and for detection in relation to the particular object, entity, or environment. The logic 160 can further be operative to cause the processing circuit 140 to provide for a scheme to add at least one ultraviolet layer and infrared layer to an image, such as a matrix or matrix barcode, useful for detection in relation to the particular object, entity, or environment, where the ultraviolet layer and/or infrared layer add additional data carrying capacity and/or security to the detectable image.

The one or more colorspace models as described herein, as stated and implied elsewhere herein, refers to any suitable colorspace model, such as colorspace employing a tristimulus system or scheme, the Red-Green-Blue (RGB), the Luminance-Alpha-Beta (LAB), an XYZ colorspace, and/or the like and/or variations of the same. Similarly, although various embodiments may refer to a particular conversion from one specific colorspace to another specific colorspace, conversions between other color spaces are contemplated and consistent with the teachings of the present disclosure.

In various embodiments, as described herein, one colorspace model (e.g., RGB or XYZ) may correspond to a higher likelihood of success in edge detection than another colorspace model in terms of detection of a displayed or printed image, e.g. barcode, in relation to an object, entity, or environment with a particular color distribution. Moreover, particular colors and color-channels associated with a colorspace may offer superior edge detection in relation to the object, entity, or environment. Some images provide optimal or near-optimal edge detection results when arranged in RGB while other images provide optimal or near-optimal edge detection results when arranged in XYZ or LAB and vice versa. By way of example, an image depicting a red balloon on a green field would appear much different in RGB than in LAB; therefore, with respect to edge detection, LAB would provide a higher likelihood than RGB at successfully identifying and locating edges (e.g., boundaries) of the red balloon, or a matrix, e.g., barcode or fiducial marker, that had a red color in the green environment.

In various embodiments, a color-channel is a distribution of colors with a first and second color of first and second highest prevalence, respectively, where the first color becomes a minimum in the color channel and the second color becomes the maximum such that the boundary may be a transition between these colors. This boundary may be at least one pixel where the color changed from the first to the second color or vice versa. If the first color is set to zero (0) and the second color is set to two hundred and fifty-five (255), then, mathematically, this boundary may be located at pixel(s) that jumped between the minimum and maximum value; for example, there may be sharp division (i.e., thin boundary) in which at least two neighboring pixels transition immediately between 0 and 255. In various embodiments, color-channels, e.g., "R," "G," and "B" define a colorspace such as RGB (e.g., a first colorspace based on a tristimulus system), and in various embodiments custom color-channels can be created using a (second) tristimulus system associated with and defining an XYZ colorspace (and/or conversions to an XYZ colorspace). In various embodiments, the color-channels can be greater than three.

In various embodiments, as discussed herein, one or more color-channel ranges are selected such that a maximum color value of one or more color channel corresponds to a unique color value, most prevalent color value, and/or highest color value of a target object, entity, and/or environment associated with a scan and the minimum color value of the color-channel corresponds to a most unique color, most prevalent color value and/or highest color value of the scannable image, e.g. matrix, matrix barcode, and/or fiducial marker, where additionally, the most prevalent value and/or highest color value of the scannable image is also a least prevalent (lowest color value) and/or absent from the target object, entity, and/or environment associated with the scan, or visa-versa (e.g. with respect to the maximum or minimum values).

In various embodiments, as described herein, particular objects, entities, or environments may have color distributions that make more complicated and varied colorspaces, and colors and color-channels associated therewith, including colors imperceptible by the human eye, more attractive for detection, in addition to increasing capacity for storage and encryption of information. As such, in various embodiments, the logic 160 is further operative to cause the processing circuit 140 to identify an image group corresponding to the patched image data. The image datasets 170 further includes image group model data correlating images with a colorspace transform model most likely to provide appropriate edge detection results. In some embodiments, the image group model data indicates which colorspace transform model to use in transforming a given image prior to edge detection in order to achieve near-optimal edge detection results. The logic 160 is further configured to cause the processing circuit 140 to select a colorspace transform mechanism 180 based upon the image group. The colorspace transform mechanism 180 is operative to transform the image data into transformed image data in accordance with another colorspace model, the other colorspace model having a higher likelihood than the colorspace model at edge detection for the image group.

In various embodiments, the system 100 can include one or more of a camera or video device 195 and/or a scanning device 197, where both device 195 and device 197 can be any suitable device for obtaining, capturing, editing, and/or scanning images, including but not limited to video or camera pictures, of objects, entities, and/or environments. The logic 160 can be configured to capture or scan images of a particular object, entity or environment using device 195 and/or device 197, where the captured images can become part of image datasets 170 and used for determining suitable colorspaces, performing colorspace conversions, and/or scanning images determined from colorspace conversions, as may be consistent with the teachings provided herein.

In various embodiments, the system 100 can include a printing device 199 (e.g. printer) or an application for the same, where images part of image datasets 170 and/or images generated by one or more components of system 100, by applying a colorspace transformation technique or mechanism, such as a scannable matrix, matrix barcode, or fiducial marker can be printed by printing device 199 and/or printing device 199 can provide a scheme for another device to print or generate an image in association with the scannable matrix, matrix barcode, or fiducial marker.

Figure 2A:
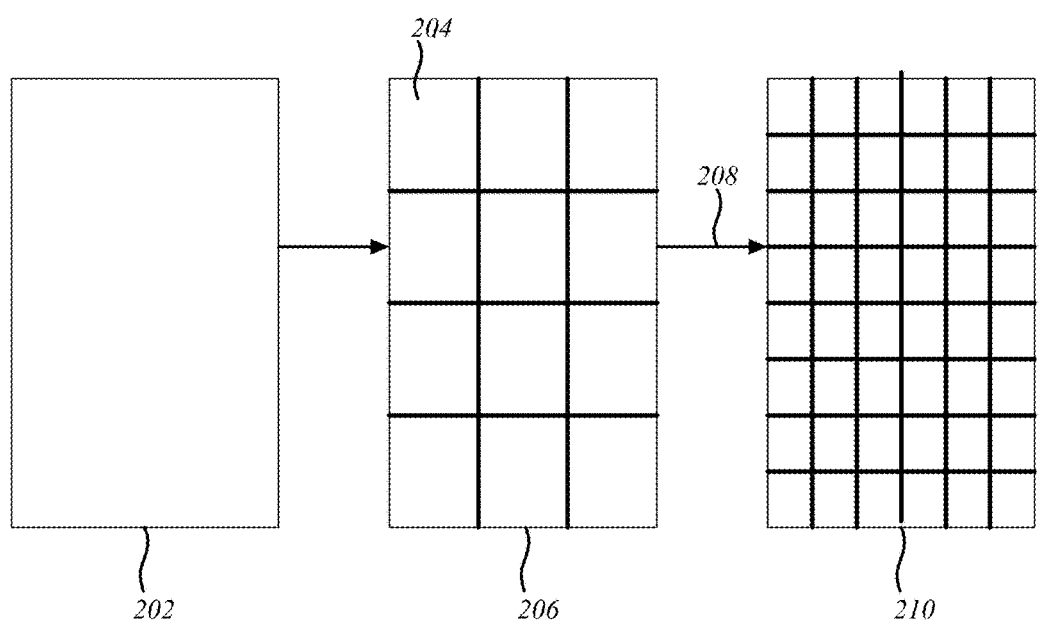
FIG. 2A illustrates an embodiment of a clustering process for the system of FIG. 1 and in accordance with at least one embodiment of the present disclosure.

FIG. 2A illustrates an embodiment of a clustering process 200A for the system 100. The clustering process 200A operates on image datasets (e.g., the image datasets 170 of FIG. 1) storing color data for images.

In some embodiments of the clustering process 200A, color data 202 of an image undergoes a patching operation where the image is processed into a plurality of patches 204 of patched image data 206. Each patch 204 of the patched image data 206 includes color data in accordance with a colorspace model, such as pixel data having RGB tuples. The clustering process 200A further processes the patched image data 206, via a transformation operation 208, by applying a colorspace transform mechanism on the color data of the patched image 206 to transform patched image data into transformed image data of a transformed image 210. The color data of the patched image 206 is configured in accordance with the colorspace model and new color data for the transformed image 210 is generated according to another colorspace model.

In some embodiments, the clustering process 200A performs a mini-colorspace transform for at least one patch of the patched image 206, possibly leaving one or more patches without a transformation. Via the transformation operation 208, the mini-colorspace transform modifies the color data in the at least one patch to transform patched image data into transformed image data of a transformed image 210. The clustering process 200A may perform stitching between patches to make the patched image 206 uniform as opposed to creating artificial edges.

Figure 2B:
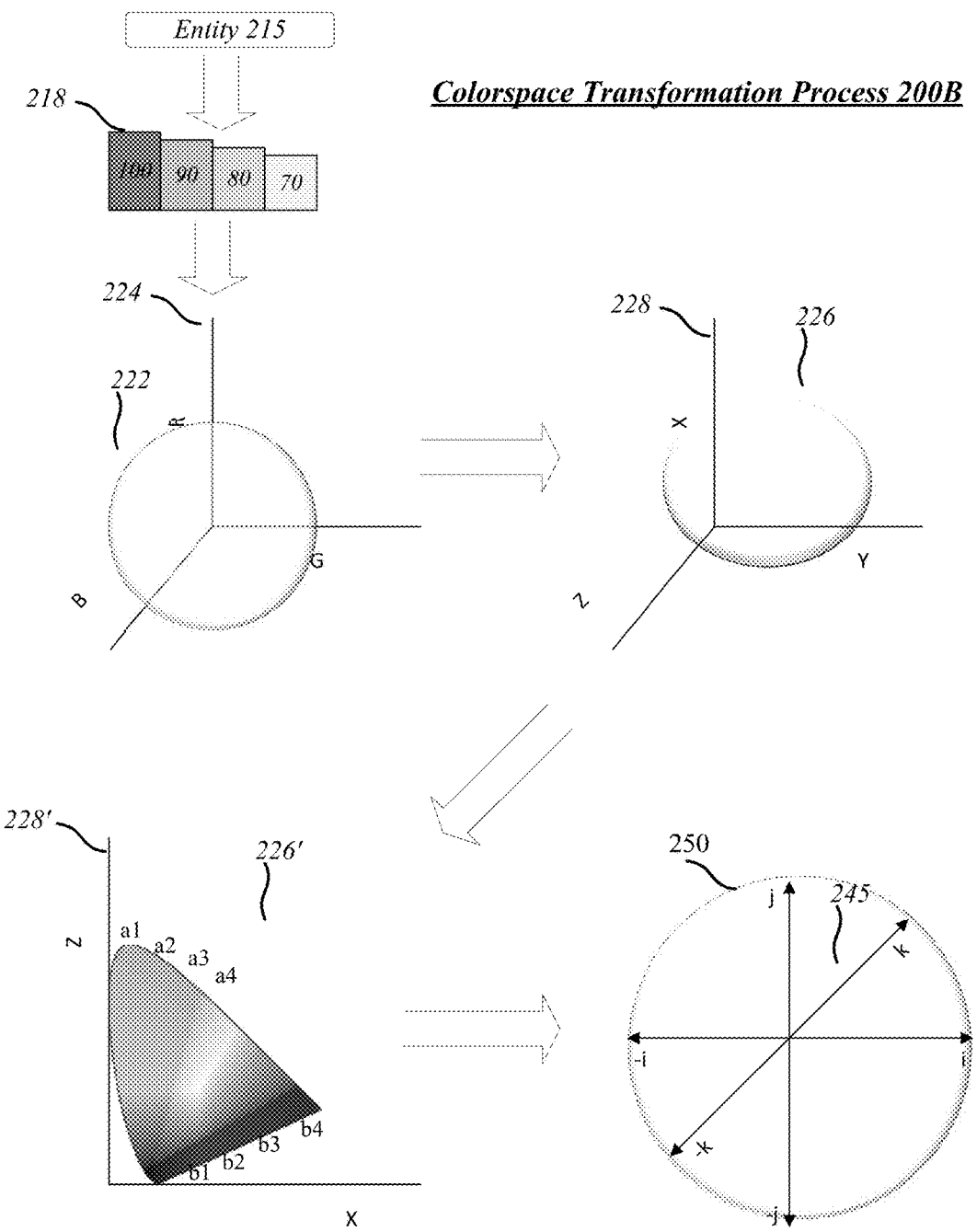
FIG. 2B illustrates an embodiment of a colorspace conversion technique for the system of FIG. 1 and in accordance with at least one embodiment of the present disclosure.

FIG. 2B illustrates an example of a colorspace conversion scheme 200B in accordance with various embodiments of the present disclosure. A histogram 218 representation of a particular object, entity, or environment 215 is provided (where the numbers 100, 90, 80, and 70 are intended to represent a simplified version of colors distribution values of one or more colors representing the particular object, entity, or environment 215). The histogram 218 can be generated by having one or more components of system 100 performing a scan of the particular object, entity, or environment 215 and generating a histogram 218 of the most prevalent colors, least prevalent colors, or absent colors of the object, entity, or environment 215. In one or more embodiments, the histogram 218 can be of four or more colors of the most prevalent colors of the object, entity, or environment. Since various embodiments of the present disclosure expressly contemplate using colors imperceptible to the human eye, there is no limitation on the number of colors that can be used with respect to the histogram 218, the colorspace conversions discussed herein, or any images generated from the colorspace conversions, including but not limited to a matrix, matrix barcode, fiducial marker, etc. can have in excess of four colors and four color-channels, where the four colors and/or four color-channels are distinct and different with respect to one another.

In various embodiments, one or more components of system 100 can determine the most prevalent colors associated with the object, entity, or environment 215, and the resulting histogram 218 may be based on that determination. The histogram 218 can be used to map the most prevalent colors to a distribution 222 associated with a suitable colorspace 224, including but not limited to an RGB colorspace 224. In various embodiments, the colors of histogram 218 are mapped pursuant to the tristimulus values of the RGB colorspace, e.g., "R," "G," and "B." Any suitable mathematical conversion, e.g., linear-algebraic, etc. can be used to map the conversion to the RGB colorspace, e.g., convert the mapped RGB colorspace to another colorspace.

In various embodiments, once the distribution 222 is mapped according to the RGB colorspace 224, one or more components of system 100 can convert the RGB distribution 222 to a new colorspace 226 with a distribution 228 pursuant to the new colorspace 226. Any suitable colorspace conversion can be used, including converting to an XYZ colorspace, where the conversion can be pursuant to any suitable mathematical conversions and equations that govern the XYZ colorspace, including suitable tristimulus conversions between RGB and XYZ. In various embodiments, "Y" represents a luminance value of the XYZ space and at least one of "X" and "Z" (or both) represent a chrominance value of the colorspace and an associated distribution, e.g. 226 plotted pursuant to the XYZ colorspace.

In various embodiments, the luminance channel "Y" is filtered out resulting in colorspace 228' and distribution 226', which can assist in making determinations solely on actual chromatic values associated with the entity, object, or environment 215, without considering luminance (this is helpful at least because colors can be used that are imperceptible to the human eye). In various embodiments, four (or more) lines can be defined by points (a1, b1), (a2, b2), (a3, b3), and (a4, b4), and are selected to have a maximum distance apart with respect to distribution 226'. In various embodiments, the points a1, a2, a3, and a4 are selected to correspond to the most prevalent colors associated with entity, object, or environment 215 and b1, b2, b3, and b4 by extension, being opposite to those colors, may represent the least prevalent or absent colors in association with an entity, object, or environment b1, b2, b3, b4. These lines may define vectors for a new colorspace conversion in an XYZ or other suitable colorspace 245 and may form the basis for new XYZ tristimulus values. An image, such as a matrix or matrix barcode, can be made using colors associated with the new colorspace 250 and a distribution 245 of colors defined by color-channel vectors (i, −i), (j, −j), (k, −k), an additional color-channel and all other color-channels (omitted from display due to the limitations of three-dimensional space) associated therewith. In various embodiments, since the colors may correspond to less prevalent or absent colors in relation to where a potential scan may occur (or what is being scanned), e.g., a matrix barcode on an entity or object and/or in an environment with colors that have a maximum difference in relation thereto, edge detection is enhanced.

Alternatively, although not expressly shown, the maximum distance from the most prevalent colors to least prevalent colors can be determined, e.g., a1 to b1, a2 to b2, etc., and then lines can be drawn from b1, b2, b3, and b4 in a direction tangential, parallel or opposite a vector or direction associated with a1, a2, a3, and a4. The color-channel vectors (i, −i), (j, −j), (k, −k), an additional color-channel and all other color-channels (omitted from display due to the limitations of three-dimensional space) associated with colorspace 250 may be entirely colors absent and/or mildly prevalent in relation to entity, object, or environment 215, which can further enhance edge detection.

In various embodiments, when performing the colorspace conversion between 228' and 250, in addition to carrying out the algebraic or other suitable conversions associated with the XYZ colorspace, the color-channel vectors, e.g. (i, −i), (j, −j), (k, −k), may be orthogonal to one another by performing any suitable mathematical and/or orientation operation on the vectors and/or by selecting suitable points on colorspace 226' and distribution 228' when making the conversion. In various embodiments, a second maximum difference between one or more points can be taken in space 250, in addition to an orientation operation to center the distribution 245 along the axis of the newly defined color-channel vectors, e.g. (i, −i), (j, −j), (k, −k), such that the color-channel vectors are orthogonal and have a maximum distance in relation to one another. In various embodiments, performing at least one of the orthogonality operation, maximum determination, and/or orienting operation can further enhance edge detection of an image generated for scanning, such as a matrix barcode, in relation to an entity, object, or environment 215 to be scanned.

In various embodiments, the various color-channels described above, including each vector, e.g. (−i, i), defines a first color that is a minimum in the color channel and the second color becomes the maximum. This boundary may be at least one pixel where the color changed from the first to the second color or vice versa. If the first color is set to zero (0) and the second color is set to two hundred and fifty-five (255), then, mathematically, this boundary may be located at pixel(s) that jumped between the minimum and maximum value; for example, there may be sharp division (i.e., thin boundary) in which at least two neighboring pixels transition immediately between 0 and 255. In various embodiments, the boundary is such it may be a transition between these colors where, as discussed above, one or more color-channel ranges are selected such that a maximum color value of one or more color channel corresponds to a unique color value, most prevalent color value, and/or highest color value of a target object, entity, and/or environment associated with a scan and the minimum color value of the color-channel corresponds to a most unique color, most prevalent color value and/or highest color value of the scannable image, e.g. matrix, matrix barcode, and/or fiducial marker, where additionally, the most prevalent value and/or highest color value of the scannable image is also a least prevalent (lowest color value) and/or absent from the target object, entity, and/or environment associated with the scan, or visa-versa (e.g. with respect to the maximum or minimum values).

The length of the color-channel can be adjusted accordingly based on the capabilities of the scanning and image-acquiring abilities of the various components, e.g. camera or video device 195, scanning device 197, and/or recognition component 422-4 (discussed below with respect to FIG. 4), where the length increases the number of different colors between the minimum and maximum point of the color channel.

In various embodiments, the conversions between the RGB colorspace to the XYZ colorspace and/or a first converted-to (derivative) XYZ space to another XYZ colorspace can be governed by the tristimulus equations (Equation 1) that define the converted colorspace and a distribution of colorspace, where the value of x+y=z can be normalized to 1.

$$x=X/(X+Y+Z),$$

$$y=Y/(X+Y+Z),$$

$$z=Z/(X+Y+Z). \quad \text{Equation 1}$$

In various embodiments, the value of "X," "Y," and "Z," is dependent on the input colors from the RGB colorspace (or in the case of a second conversion, from the converting colorspace). Although the tristimulus values are three be definition, as noted above, the conversion can involve more than three color-channels, including color-channels that define colors imperceptible to the human eye. In various embodiments, the conversion governed by Equation. 1 can form a key for a scanning device to scan an image defined by the conversion, such as a matrix, e.g., matrix barcode or fiducial marker. In various embodiments, this means that in addition to providing a vehicle for increasing the numbers of color-channels and colors for an image to be scanned, which means increasing bits of information that can be encoded therein, another benefit of various embodiments is offering a manner to securely encode information, e.g. without knowing the equation or equations of what colorspace govern and without knowing the input values (which are based on the first colorspace associated with the entity, object, or environment 215), a successful scan cannot occur. Accordingly, in various embodiments, the logic 160 of system 100 can cause a processor 140 (or an application programmed to carried out the operations of 100) to provide a scanning device 197 with a key governed by Equation 1 in order to scan an image that is encoded pursuant to one or more colorspace conversions associated with Equation 1.

In various embodiments, the logic 160 of system 100 can cause a processor 140 to provide a scheme for adding either one or both of an ultraviolet layer and/or an infrared layer to an image, such as a matrix, e.g. matrix barcode or fiducial marker, where the image contains more than one non-black or non-white colors governed by any suitable colorspace. In various embodiments, the scheme may include both an ultraviolet layer and an infrared layer, where the ultraviolet layer may form the first layer of an image in order to take advantage of its properties. In various embodiments, the non-black and non-white colors of the scannable image may be determined by one or more colorspace conversion techniques as outlined herein. In various embodiments, Non-black and non-white colors means colors that are not black or white. In various embodiments, non-black and non-white colors means colors that are not black, white or based on a greyscale distribution.

Figure 3:
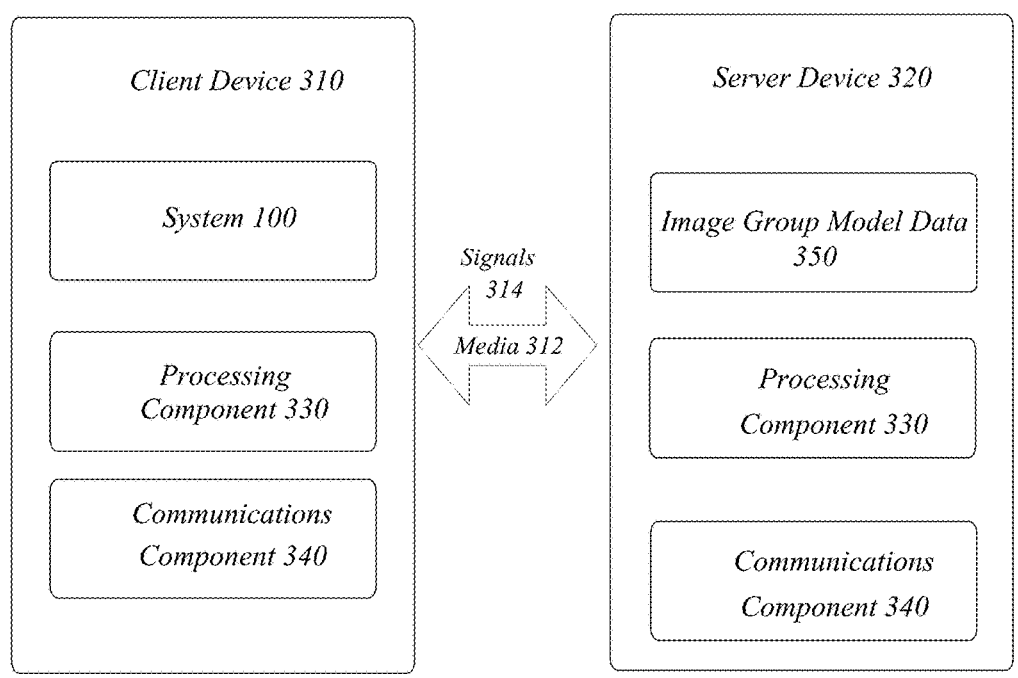
FIG. 3 illustrates an embodiment of a centralized system for the system of FIG. 1 in accordance with at least one embodiment of the present disclosure.

FIG. 3 illustrates a block diagram of a distributed system 300. The distributed system 300 may distribute portions of the structure and/or operations for the system 100 across multiple computing entities. Examples of distributed system 300 may include without limitation a client-server architecture, a 3-tier architecture, an N-tier architecture, a tightly-coupled or clustered architecture, a peer-to-peer architecture, a master-slave architecture, a shared database architecture, and other types of distributed systems. The embodiments are not limited in this context.

The distributed system 300 may comprise a client device 310 and a server device 320. In general, the client device 310 and/or the server device 320 may be the same or similar to the apparatus 120 as described with reference to FIG. 1. For instance, the client device 310 and the server device 320 may each comprise a processing component 330 which is the same or similar to the processing circuit 140 as described with reference to FIG. 1. In another example, the devices 310, 320 may communicate over a communications media 312 using communications signals 314 via a communications component 340.

The server device 320 may communicate with other devices over the communications media 312, using communications signals 314, via the communications component 340. The other devices may be internal or external to the device 320 as desired for a given implementation.

The client device 310 may comprise or employ one or more client programs that operate to perform various methodologies in accordance with the described embodiments. In one embodiment, for example, the client device 310 may implement the system 100 including the logic 160 of FIG. 1, where in various embodiments, the client device 310 can implement one or more operations to form an image based on one or more colorspace conversions as outlined above and herein.

The server device 320 may comprise or employ one or more server programs that operate to perform various methodologies in accordance with the described embodiments. In one embodiment, for example, the server device 320 may implement the clustering process 200A of FIG. 2A and generate image group model data 350 and/or generate image group model data 350 by performing one or more of the colorspace conversion operations of scheme 200B. The image group model data 350 can include a printing scheme or color distribution for an image to be scanned in an entity, object, or environment 215, such as a matrix, e.g., matrix barcode or fiducial marker.

The devices 310,320 may comprise any electronic device capable of receiving, processing, and sending information for the system 100. Examples of an electronic device may include without limitation an ultra-mobile device, a mobile device, a personal digital assistant (PDA), a mobile computing device, a smart phone, a telephone, a digital telephone, a cellular telephone, ebook readers, a handset, a one-way pager, a two-way pager, a messaging device, a computer, a personal computer (PC), a desktop computer, a laptop computer, a notebook computer, a netbook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, game devices, television, digital television, set top box, wireless access point, base station, subscriber station, mobile subscriber center, radio network controller, router, hub, gateway, bridge, switch, machine, or combination thereof. The embodiments are not limited in this context.

The devices 310, 320 may execute instructions, processing operations, or logic for the system 100 using the processing component 330. The processing component 330 may comprise various hardware elements, software elements, or a combination of both. Examples of hardware elements may include devices, logic devices, components, processors, microprocessors, circuits, processing circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), Application-specific Standard Products (ASSPs), System-on-a-chip systems (SOCs), Complex Programmable Logic Devices (CPLDs), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The devices 310, 320 may execute communications operations or logic for the system 100 using communications component 340. The communications component 340 may implement any well-known communications techniques and protocols, such as techniques suitable for use with packet-switched networks (e.g., public networks such as the Internet, private networks such as an enterprise intranet, and so forth), circuit-switched networks (e.g., the public switched telephone network), or a combination of packet-switched networks and circuit-switched networks (with suitable gateways and translators). The communications component 340 may include various types of standard communication elements, such as one or more communications interfaces, network interfaces, network interface cards (NIC), radios, wireless transmitters/receivers (transceivers), wired and/or wireless communication media, physical connectors, and so forth. By way of example, and not limitation, communication media 312 include wired communications media and wireless communications media. Examples of wired communications media may include a wire, cable, metal leads, printed circuit boards (PCB), backplanes, switch fabrics, semiconductor material, twisted-pair wire, co-axial cable, fiber optics, a propagated signal, and so forth. Examples of wireless communications media may include acoustic, radio-frequency (RF) spectrum, infrared and other wireless media.

Figure 4:
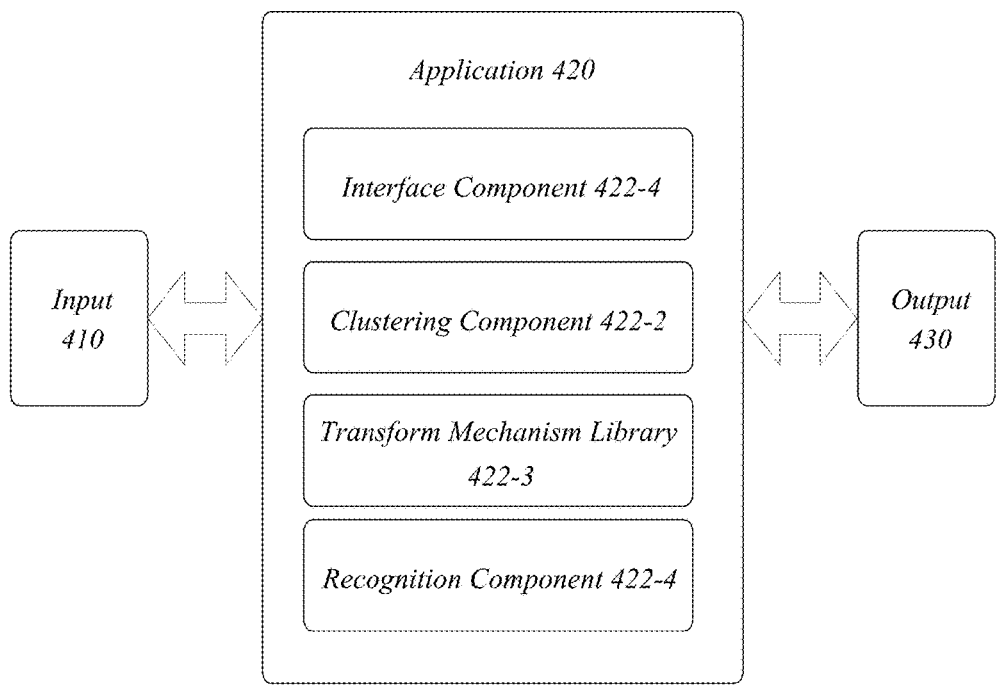
FIG. 4 illustrates an embodiment of an operating environment for the system of FIG. 1 in accordance with at least one embodiment of the present disclosure.

FIG. 4 illustrates an embodiment of an operational environment 400 for the system 100. As shown in FIG. 4, the operating environment 400 includes an application 420, such as an enterprise software application, for processing input 410 and generating output 430.

The application 420 comprises one or more components 422-a where a represents any integer number. In one embodiment, the application 420 may comprise an interface component 422-1, a clustering component 422-2, a transform mechanism library 422-3, and a recognition component 422-4. The interface component 422-1 may be generally arranged to manage a user interface for the application 420, for example, by generating graphical data for presentation as a Graphical User Interface (GUI). The interface component 422-1 may generate the GUI to depict various elements, such as dialog boxes, HTML forms having rich text, and/or the like.

The clustering component 422-2 may be generally arranged to organize images into image groups or clusters. Some embodiments of the clustering component 422-2 execute the clustering process 200A of FIG. 2A and/or one or more of the colorspace conversion operations of scheme 200B of FIG. 2B and generates the image group model data 350 of FIG. 3. In various embodiments, the clustering component 422-2 identifies, for each image group, a particular colorspace transform having a higher likelihood than a current colorspace transform of success in edge detection for that group as outlined herein or otherwise suitable. In various embodiments, the clustering component 422-2 may perform the above-mentioned clustering process for a variety of edge detection techniques, resulting in sets of image groups where each set of image groups corresponds to a particular technique. Edge detection techniques vary in how boundaries are identified in an image; some techniques detect differences in color whereas other techniques measure another attribute. Some techniques differ with respect to how color differences are even measured. It is possible for one technique to alter certain steps and create multiple techniques.

The colorspace transform library 422-3 includes a plurality of colorspace transform mechanisms and may be generally arranged to provide a colorspace transform mechanism for application on an image, transforming that image into a transformed image in accordance with a different colorspace model than the image's original colorspace model. As described herein, the colorspace model refers to a technique for modeling an image's color data, such as in RGB or in LAB, or RGB to XYZ, or RGB to XYZ to another XYZ. In general, and as outlined in one or more embodiments herein, the colorspace transform mechanism performs mathematical operations to map a data point within the image's original/current colorspace model into a corresponding datapoint in accordance with the different colorspace model. This may involve converting the datapoint's value(s)—which are in one domain—into corresponding value(s) for the corresponding datapoint. As example, the colorspace transform may convert an RGB pixel having a tuple of RGB values into a LAB pixel having a tuple of LAB values, an RGB pixel having a tuple of RGB values into an XYZ pixel having a tuple of XYZ values, and/or an RGB pixel having a tuple of RGB values into an XYZ pixel having a tuple of XYZ values and again into another XYZ pixel having a tuple of other XYZ values. The pixels associated with the final conversion can define a color distribution for a scannable image, such as a matrix or matrix barcode that is used for a scan in association with an entity, object, or environment.

The recognition component 422-4, such as a suitable scanner, printer and/or camera or application for the same, may be generally arranged to execute an edge detection technique as part of a recognition operation on the transformed image. One example of a well-known recognition operation is Optical Character Recognition (OCR). The application 420 invokes the recognition component 422-4 to perform various tasks including scanning a matrix, e.g., matrix barcode or fiducial marker, for verifying an authenticity of an item and/or to obtain encoded information associated with the barcode. The recognition component 422-4 can be configured to contain a key, e.g. a mathematical equation or equations with specified inputs defining a colorspace conversion, such that it scans relevant colors reflected by the barcode, where the colors are based on one or more colorspace transformation techniques as outlined herein, where the key defines a final transformation that defines color-channels and a colorspace associated with colors of the scannable image, and where color-channels defined by the key each represent at least one bit of encoded data.

In various embodiments, the recognition component 422-4 can print or provide a schema for printing an image, e.g., barcode and/or fiducial marker, that contains one or more non-black and non-white colors and one or both of an ultraviolet layer and an infrared layer. The color-channels associated with each non-black and non-white color each can constitute at least one bit of data, and each one of the infrared and ultraviolet layers can each constitute one bit of data. In various embodiments, each one of the non-black and non-white colors are generated by a colorspace transformation mechanism or technique and are scannable by a key associated with the transformation mechanism. In various embodiments, the number of color-channels can be adjusted to be greater than or equal to four color-channels, as the recognition component 422-4 can be adjusted to scan any number of colors, including colors not perceptible to the human eye.

In various embodiments, the non-black and non-white color-channel can be used in conjunction with one or both of the infrared or ultraviolet layers on a scannable image, such as a matrix, matrix barcode and/or fiducial marker, where each of one of the color-channels, ultraviolet layer(s), and/or infrared layer(s) represent a bit of data and a different manner of encoding data into the image, and as such, six or more bits of data can be encoded into the image. In various embodiments, the ultraviolet layer may be printed or displayed first in relation to the infrared layers and the various layers associated with non-black and non-white color-channels to take advantage of the ultraviolet layer's properties.

In various embodiments, the image containing all or one of the layers associated with the non-black and non-white color-channel layers, the ultraviolet layers, and the infrared layers can be scanned by the recognition component 422-4 for a verification component, where the recognition component 422-4 may contain or receive a key that is based on an equation related to a colorspace conversion, e.g. Equation 1, where the colorspace conversion reveals the relevant color-channels with associated colors containing the information, in addition to one or more verification bits indicating whether the presence or absence of an ultraviolet and/or infrared layer is indicative of encoded information. Accordingly, the key and/or verification bit provides a manner of decoding information.

In various embodiments, application 420 is configured to contain the key and/or verification bit and provide an output 430 once the scan of the image, e.g., barcode, is verified locally. In various embodiments, the recognition component 422-4 can require an additional verification step of contacting a host system that contains one or more of the functionalities of system 100, to confirm, e.g., by one or more comparison steps, that the key and/or verification bit used by the recognition component 422-4 is accurate. If the key is accurate, and the scan is confirmed by the recognition component 422-4, then the output 430 of application 420 is one or more access, transfer, or receipt of information, including currency, personal, and/or financial information, to another entity.

In various embodiments, scanning the image, e.g., matrix, a matrix barcode, and/or fiducial marker can be done to protect a user from financial misappropriation. The recognition component 422-4 may perform the text or image recognition operation to determine whether the image, e.g., barcode, is valid, and relates the validity of the scan to a verification or access of information that includes any sensitive information, such as a password or social security number (SSN), according to some embodiments. The application 420 may invoke the recognition component 422-4 to scan an image, e.g. a barcode, prior to publishing social network content such that a potential failure to properly scan the image, e.g. the component scanning the image does not have a key that properly decodes it pursuant to the key related to the colorspace information and/or the bit indicating that an ultraviolet and/or infrared layer contains information, identification of sensitive information in that content prevents said publishing. In various other embodiments, the scanning of the image, e.g., barcode, can provide initiation of a financial transaction, e.g., transfer of any suitable electronic funds.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art may understand and appreciate that a methodology could alternatively be represented as a series of interrelated states or events, such as in a state diagram. Moreover, not all acts illustrated in a methodology may be required for a novel implementation.

FIG. 5A illustrates one embodiment of a logic flow 500A. The logic flow 500A may be representative of some or all of the operations executed by one or more embodiments described herein.

In the illustrated embodiment shown in FIG. 5A, the logic flow 500A receives a representative dataset of a target, such as an entity, object, or environment 502. For example, the logic flow 500 may receive a representative dataset containing at least one of i) one or more images of a target and ii) one or more videos of the target, the target including at least one of i) an environment, ii) a live entity and iii) an object using any suitable camera or scanning device, where the representative dataset is contained in image group model data 350 or obtained directly by scanning the target using any suitable device, e.g., camera or video device 195 and/or scanning device 197. In various embodiments, the target may be an environment that contains a scannable image therein.

The logic flow 500A may process the representative dataset into a suitable representation of a color scheme, such as a histogram 504. For example, the logic flow 500 may examine image group model data 350, which contains captured data of a scanned environment. Once the logic flow 500 identifies the scanned data of the environment, the logic flow can process that data into a histogram of a particular colorspace, e.g., an RGB colorspace.

The logic flow 500A may identify the most prevalent colors of the environment utilizing the histogram 506. In various embodiments, the logic flow identifies the most prevalent colors in order to apply a colorspace transform mechanism for substantially maximizing edge detection for a scannable image, such as a matrix, matrix barcode, fiducial marker, etc.

The logic flow 500A may determine a related number of colors based on the histogram 508, e.g., the histogram is used to map to a first colorspace, where least prevalent and/or absent colors in relation to the most prevalent colors of the target are determined, and the least prevalent and/or absent colors form the basis for one or more color-channels in a second colorspace.

In various embodiments, the related plurality of colors can represent a range of colors between the most prevalent colors and the least prevalent colors and/or absent colors of the target, including sole colors that are absent in relation to the target and/or colors that are the least prevalent in association with the target. In various embodiments, in order to determine the related number of colors based, the logic flow may select and apply a colorspace transform mechanism to the image data associated with the histogram. As described herein, the image data includes color data configured in accordance with a colorspace model, e.g., the histogram can be used to create a colorspace representation of the target data. In some embodiments, the logic flow 500 applies the colorspace transform mechanism 180 of FIG. 1 by converting the image data into transformed image data comprising color data in accordance with another colorspace model that differs from the colorspace associated with the histogram. For example, the logic flow may create a histogram of the image data associated with the target, then use the histogram to create a first colorspace representation of the target, e.g., an RGB colorspace representation. Thereafter, as discussed below, the logic flow can perform one or more additional colorspace transformation techniques into other colorspaces, such as XYZ colorspaces or any other suitable colorspace that utilizes a tristimulus system.

In various embodiments, the logic flow 500A may perform a colorspace transform manipulating the color data of the original image data to enable efficient edge detection on the transformed image data. As explained below, the logic flow 500A may change the colorspace model to quickly identify boundaries, such as when two colors are close in proximity. The logic flow 500A examines each datapoint in the image, and for each location, the logic flow 500A identifies a color. In various embodiments, the colorspace conversion can be based on at least one set of color coordinates for each one of the most prevalent colors according to the another (or second) colorspace and determining at least one set of color coordinates corresponding to the related plurality of colors in the (second) another colorspace, where the at least one set of coordinates of the most prevalent plurality of colors being either one or both of perpendicular/orthogonal and a maximal distance away, with respect to another colorspace, to the at least one set of coordinates of the related colors. In various embodiments, the second colorspace can be considered a derivative colorspace of the first color space.

In various embodiments, this ensures that the colors used for a scannable image may maximize edge detection, as the maximal distance away between prevalent color-channels and colors of the target in the environment and other color-channels and colors (the related color-channels and colors) ensures that the related color-channels and colors are either absent in the target and/or least prevalent in the target. Additionally, if the related colors and color-channels are selected to be perpendicular or orthogonal in relation to the target color-channels and colors (and with respect to one another), this may further enhance edge detection.

In one example utilizing the one or more techniques outlined above, the logic flow 500A proceeds to identify two or more colors by prevalence in the target and configures them into one channel. Take, for instance, a first color and second color of first and second highest prevalence, respectively, where the first color becomes a minimum in the color channel and the second color becomes the maximum such that the boundary may be a transition between these colors. This boundary may be at least one pixel where the color changed from the first to the second color or vice versa. If the first color is set to zero (0) and the second color is set to two hundred and fifty-five (255), then, mathematically, this boundary may be located at pixel(s) that jumped between the minimum and maximum value; for example, there may be sharp division (i.e., thin boundary) in which at least two neighboring pixels transition immediately between 0 and 255.

As alluded to above, these color-channels can correspond to a first colorspace, e.g., RGB, where the first colorspace can be based on the first set of tristimulus values, and where the first-colorspace may have a color coordinates for representing colors of the target, e.g., the most prevalent colors of the target. The logic flow 500A may then identify one or more colors that are either unused or barely used (i.e., least prevalent or absent) and establish those colors in another channel to be opposite of the above-identified prevalent colors, where the new color-channel (or color-channels) forms the basis for a new colorspace, e.g., a new set of tristimulus values of an XYZ colorspace, and where the first colorspace is converted to the second colorspace.

Then, the logic flow 500A may perform one or more additional operations, e.g. configuring each color-channel of the new colorspace to be perpendicular or orthogonal to one another in the new colorspace model, make an additional conversion to a third colorspace, including an intermediary operation that filters out non-chromacity related features such as luminance or brightness channel, and/or perform an orientation operation in the second (or third) colorspace prior to making the color-channels perpendicular or orthogonal to each other (in order to maximize the distance between color-channels and thus enhancing edge detection).

The logic flow 500A may utilize the related colors of block 508 to create one or more scannable images 510, such as a matrix, matrix barcode, fiducial marker, or any other suitable image for scanning. In various embodiments, the related colors may be colors of each color-channel associated with the final colorspace conversion as discussed above, e.g. a plurality of color-channels and associated colors, as may be represented in an XYZ colorspace, that are either not prevalent in the target and/or are completely absent in the target, where, in various embodiments, the least prevalent and/or absent colors can be arranged orthogonally to each other to further enhance edge detection. In various embodiments, the scannable image may be a matrix barcode that is formed to reflect colors of each of the least prevalent and/or absent and/or orthogonal color-channels in relation to a target, e.g., environment containing the matrix barcode.

In various embodiments, the matrix barcode is embedded with information that is based on the colorspace conversions, e.g., each pixel or pixels associated with the matrix bar code is associated with a color-channel of the final colorspace, e.g. the XYZ colorspace with color-channels representing the least prevalent or absent colors of the environment, where each color-channel represents a bit of data, and where the number of color-channels can be three or more, four or more, etc. (as there are no limitations imposed by human perceptibility), and by extension the number of encoded bits can be three or more, four or more, etc.

In various embodiments, where four or more colors are used, each one of the four or more colors are distinct colors in relation to one another, and based on the colorspace techniques discussed herein and above, the four or more colors are derived from a plurality of coordinates corresponding to each one of the at least four distinct colors along a converted-to (derivative) colorspace, where the converted-to (derivative) colorspace contains a plurality of coordinates sets representing the at least four prevalent colors of the target, e.g., environment, and each of the four or more colors corresponds to a distinct coordinate set of the converted-to (derivative) colorspace.

In various embodiments, each of the four or more distinct colors are selected based on having a maximal opposite coordinate relationship with respect to at least one of the plurality of coordinate sets representing at least four prevalent colors in the target, e.g., environment.

There are a number of applicable edge detection techniques, and the edge detection technique 190 may be appropriate for the one colorspace model of the transformed image data while another edge detection technique may be appropriate for the original colorspace model. The embodiments are not limited to this example.

FIG. 5B illustrates one embodiment of a logic flow 500B. The logic flow 500B may be representative of some or all of the operations executed by one or more embodiments described herein.

In the illustrated embodiment shown in FIG. 5B, the logic flow may detect a matrix that includes one or more non-black and non-white colors, where each of the non-black and non-white colors is i) at least one of an absent color in relation to an environment and/or ii) at least one least prevalent color associated with the environment 515. In various embodiments, the matrix is a barcode constructed with one or more colorspace conversion techniques as outlined herein, e.g., the matrix barcode is derived from an RGB colorspace and a derivative colorspace of the RGB colorspace (a converted-to (derivative) colorspace from the RGB colorspace, such as an XYZ colorspace). In various embodiments, the derivative colorspace is an XYZ colorspace with a filtered luminance channel.

In various embodiments, the barcode can be scanned with any suitable component, e.g., a scanning device 197, that has a suitable key, e.g., tristimulus equations associated with a conversion to an XYZ colorspace, that reveals the color-channels with associated colors that are associated with the scannable portions of the matrix barcode, including, in various embodiments, information encoded in the matrix barcode. In various embodiments, the barcode can include four or more distinct colors each associated with at least four-distinct color-channels, where each of the colors is different from one another and different from the most prevalent colors of the environment. In various embodiments, the colors and color-channels of the barcode can be computed according to coordinate relationships between the most prevalent colors and the least prevalent and/or absent colors in the derivative colorspace, including a maximal distance between the most prevalent colors and the least prevalent and/or absent colors. Additional or different colorspace conversion techniques can be used as discussed herein, and this is merely one example consistent with the present disclosure.

Figure 7:
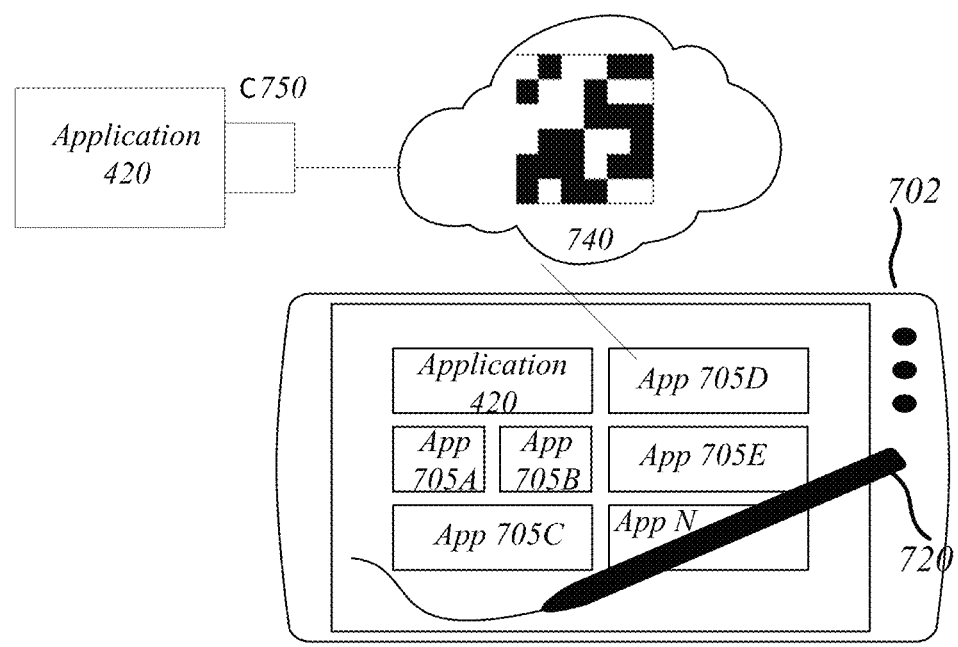
FIG. 7 illustrates a computer device for generating and scanning a scannable image in accordance with at least one embodiment of the present disclosure.

In various embodiments, the barcode can be printed and/or embedded on a physical medium, e.g., a physical surface or material, using any suitable component, e.g., printing device 199, with the least prevalent and/or absent colors, and the barcode can be scanned along the surface of the physical surface. In other embodiments, any suitable computer device, including a computer, laptop, or tablet (as shown in FIG. 7 provided for below) can be configured to generate a scannable barcode that reflects the least prevalent or absent colors, where the barcode can be scanned along a surface of the computer display.

The logic flow 500B may transmit the result of the scan to any suitable computer device 520 as discussed herein, including an indication as to whether or not the scan was of the barcode was successful, and any encoded information associated therewith was obtained.

Figure 5C:
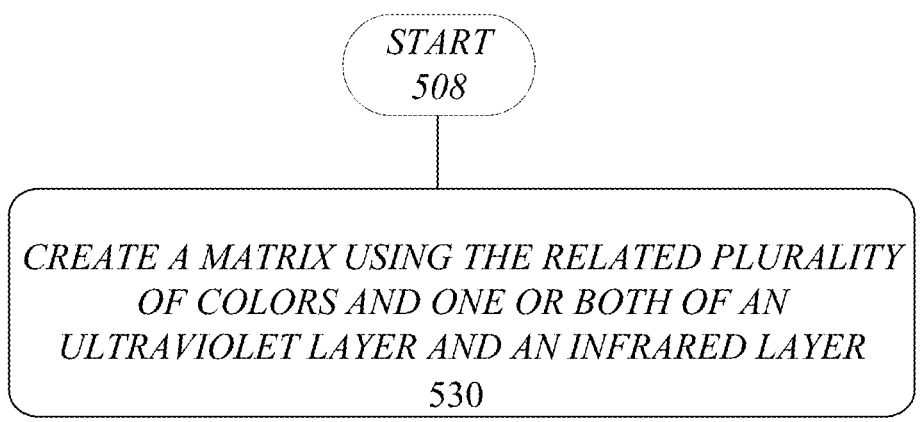
FIG. 5C illustrates an embodiment of a third logic flow for the system of FIG. 1 in accordance with at least one embodiment of the present disclosure.

FIG. 5C illustrates one embodiment of a logic flow 500C. The logic flow may be representative of some or all of the operations executed by one or more embodiments described herein.

In the illustrated embodiment shown in FIG. 5C, the logic flow 500C carries out one or more of the operations of flow 500C, wherein one embodiment it carries out the operations of 502, 504, 506, and 508.

The logic flow 500C may utilize the related colors to produce a scannable image 530, such as a matrix, matrix barcode, fiducial marker, or any other suitable image for scanning, where the scannable image can, in addition to including non-black and non-white colors (such as the least prevalent and/or absent colors associated with a target, e.g. an environment), can include one or both of an ultraviolet layer and an infrared layer. In various embodiments, the matrix, matrix barcode, fiducial marker, or any other suitable image can be printed and/or embedded on a physical surface using any suitable component, e.g. printing device 199, with the least prevalent and/or absent colors and an infrared and/or ultraviolet layer, and the barcode can be scanned along the surface of the physical surface. In other embodiments, any suitable computer device, including a computer, labtop, or tablet (as shown in FIG. 7 provided for below) can be configured to generate a scannable barcode that reflects the least prevalent or absent colors, the ultraviolet layer and/or the infrared layer, where the matrix, matrix barcode, fiducial marker, or any other suitable image can be scanned along a surface of the computer display.

In various embodiments, the ultraviolet layer may be printed first along the physical surface and/or may form the top layer generated on a computer screen in order to maximize the benefits associated with ultraviolet light. In various embodiments, the colors of the scannable image need not be colors that have a relationship with the environment and/or not based on colorspace conversion techniques and can be any colors, including standard black and white colors, with a scannable image containing both an infrared and ultraviolet layer for detection.

FIG. 5D illustrates one embodiment of a logic flow 500D. The logic flow 500D may be representative of some or all of the operations executed by one or more embodiments described herein.

In the illustrated embodiment shown in FIG. 5D, the logic flow may detect a scannable image, e.g., a matrix, that includes one or more non-black and non-white colors, where each of the non-black and non-white colors are at least one of an i) an absent color in relation to an environment and/or ii) a least prevalent color associated with the environment, in addition to one or both of an ultraviolet layer and/or an infrared layer 540. In various embodiments, the matrix is a barcode constructed with one or more colorspace conversion techniques as outlined herein, e.g., as discussed with respect to FIG. 5B, with the addition of an ultraviolet layer and/or infrared layer.

In various embodiments, the scannable image, e.g. barcode, can be scanned with any suitable component, e.g. a scanning device 197, that has a suitable key, e.g. tristimulus equations associated with a conversion to an XYZ colorspace, that reveals the color-channels with associated colors that are associated with the scannable portions of the matrix barcode, including, in various embodiments, information encoded in the matrix barcode. In addition to the key, any suitable component, e.g., scanning device 197, can also have a verification bit indicating whether the ultraviolet layer and/or infrared layer is associated with information, and if so, performs the scan and/or decodes the information based on the verification bit. In various embodiments, the barcode can include four or more distinct colors each associated with at least four distinct color-channels, where each of the colors are different from one another and different to the most prevalent colors of the environment, in addition to also having one or both the ultraviolet layer and/or the infrared layer, and as such, the scan can be a scan of six or more bits of information.

In various embodiments, the barcode can be printed and/or embedded on a physical surface using any suitable component, e.g., printing device 199, with the least prevalent and/or absent colors, and the barcode can be scanned along the surface of the physical surface. In other embodiments, any suitable computing device, including a computer, labtop, or tablet (as shown in FIG. 7 provided for below) can be configured to generate a scannable barcode that reflects the least prevalent or absent colors, where the barcode can be scanned along a surface of the computer display. In various embodiments, the printing of the scannable image, e.g., barcode, can be such that the topmost layer may be an ultraviolet layer and any associated scan may account for the ultraviolet layer first. Similarly, in various embodiments, if the scannable image is generated by a computer device and displayed by a computer display, the first layer displayed by the computer device can be the ultraviolet layer.

The logic flow 500D may transmit the result of the scan to any suitable computer device 550 as discussed herein, including an indication as to whether or not the scan was of the barcode was successful, and any encoded information associated in addition to that was obtained.

Figure 6A:
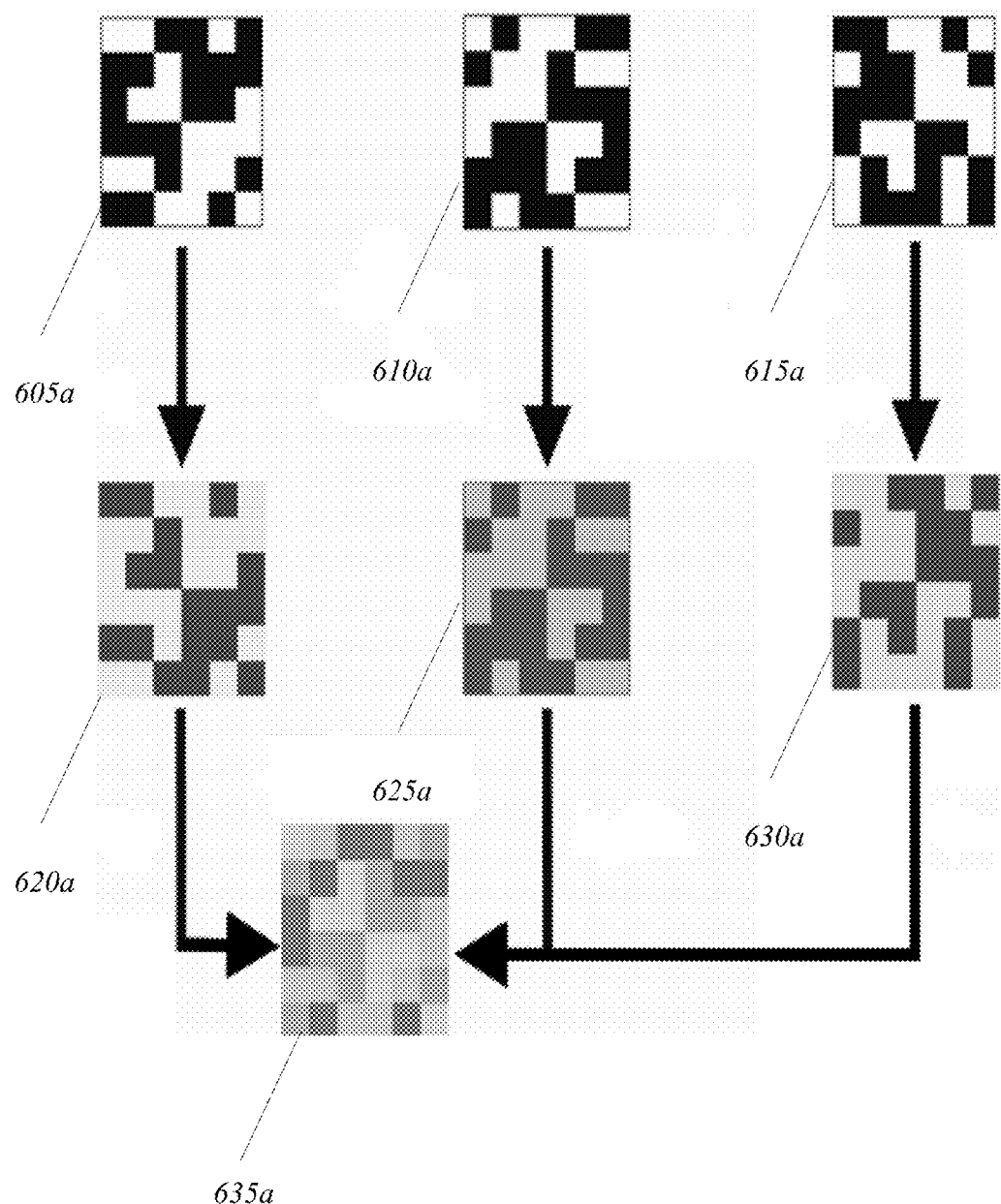
FIG. 6A illustrates formation of a scannable image in accordance with at least one embodiment of the present disclosure.

FIG. 6A illustrates one technique 600A of forming a scannable image in accordance with at least one embodiments of the present disclosure. Scannable image layers 605a, 610a, and 615a each represent a layer of a scannable image, such as a barcode, associated with one or more colors. Any suitable component as disclosed herein may perform one or more colorspace transformation techniques on each scannable image layers 605a, 610a, 615a in order to produce layers 620a, 625a, and 630a, and layers 620a, 625a, and 630a may be consolidated into a single scannable image, e.g., barcode, 635a. In various embodiments, the scannable layers 620a, 625a, and 630a may each be associated with a color-channel that represents one or more colors that are absent and/or not prevalent in relation to a target that may be associated with the scannable image 635a, wherein various embodiments one or more color-channels associated with colors of 620a, 625a, and 630a may be orthogonal or perpendicular in relation to one another and with respect to colorspaces representing those colors. The scannable image 635a can be printed on a physical surface of a target using any suitable device and/or generated by any suitable computing device for display on a computer display.

Although the embodiment of FIG. 6A illustrates performing a transformation technique with respect to color schemes that are associated with existing scannable image layers 605a, 610a, and/or 615a, scannable image 635a can be generated from scratch without converting from existing images, e.g., a target can be scanned, colorspaces associated therewith determined therefrom, and a final scannable image 635a can be produced by performing one or more colorspace transformations on the colorspaces as disclosed herein or otherwise suitable.

Figure 6B:
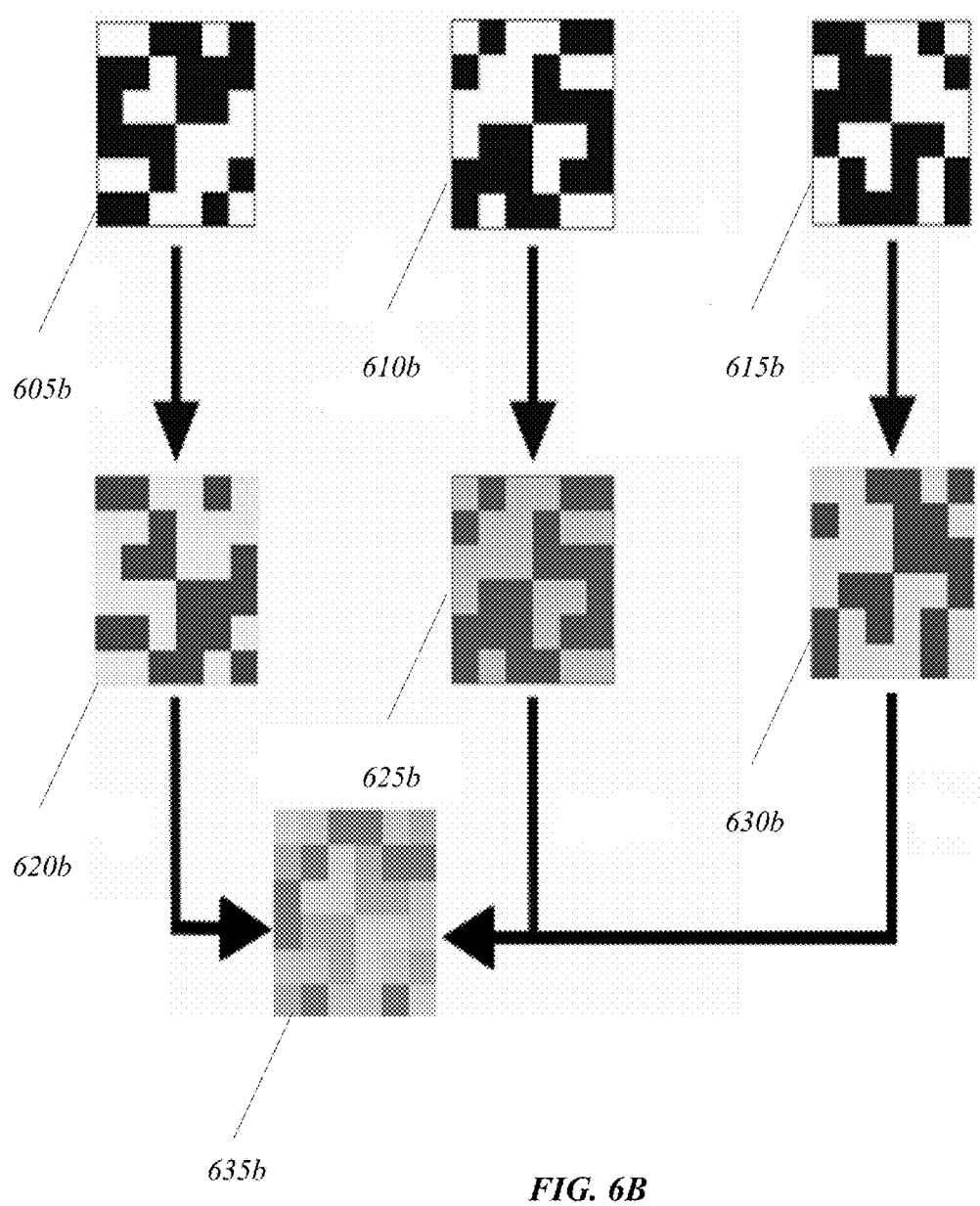
FIG. 6B illustrates formation of a scannable image in accordance with at least one embodiment of the present disclosure.

FIG. 6B illustrates one technique 600B of forming a scannable image in accordance with at least one embodiments of the present disclosure. Scannable image layers 605b, 610b, and 615b each represent a layer of a scannable image, such as a barcode, associated with one or more colors. Any suitable component as disclosed herein may perform one or more colorspace transformation techniques on each scannable image layers 605b, 610b, 615b in order to produce layers 620b, 625b, and 630b, and layers 620b, 625b, and 630b may be consolidated into a single scannable image 635b, e.g., barcode, 635b. In various embodiments, the scannable layers 620b, 625b, and 630b may each be associated with a color-channel that represents one or more colors that are absent and/or not prevalent in relation to a target that may be associated with the scannable image 635b, wherein various embodiments one or more color-channels associated with colors of 620b, 625b, and 630b may be orthogonal or perpendicular in relation to one another and with respect to colorspaces representing those colors. In various embodiments, at least one layer, e.g. 630b, can be made with ultraviolet or infrared ink or generated using ultraviolet or infrared light such that it contains an additional channel of information, e.g., an ultraviolet layer or infrared layer of information, which can absorb, reflect, project, and/or illuminate ultraviolet or infrared light, wherein various embodiments the ultraviolet layer or infrared layer 630b may be the first layer of image 635b. In various embodiments, the ultraviolet or infrared layer 630b may contain a color-channel layer representing various colors, including colors that are not prevalent and/or absent from a target to be associated with the scannable image 635b, and in various embodiments, only an ultraviolet channel may be associated with the ultraviolet layer 630b.

In various embodiments, the scannable image 635b can be printed on a physical surface of a target using any suitable device and/or generated by any suitable computer device for display on a computer display.

In various embodiments, the scannable image 635b is a fiducial marker that takes advantage of the inherent orienting features of ultraviolet and/or infrared light when being scanned by a suitable device that can detect either one or both of ultraviolet and/or infrared light. In various embodiments, when a suitable device, e.g., scanning device 197, scans a fiducial marker 635b that reflects ultraviolet and/or infrared light, the spatial relationship of the object associated with the fiducial maker 635b, e.g. an object with the fiducial marker labeled thereon and/or a computer display generating the fiducial marker 635b, in relation to the scanning device 197 and other objects in an environment containing the device is easier to ascertain because of the inherent properties associated with the reflection and detection of ultraviolet and/or infrared light.

Figure 6C:
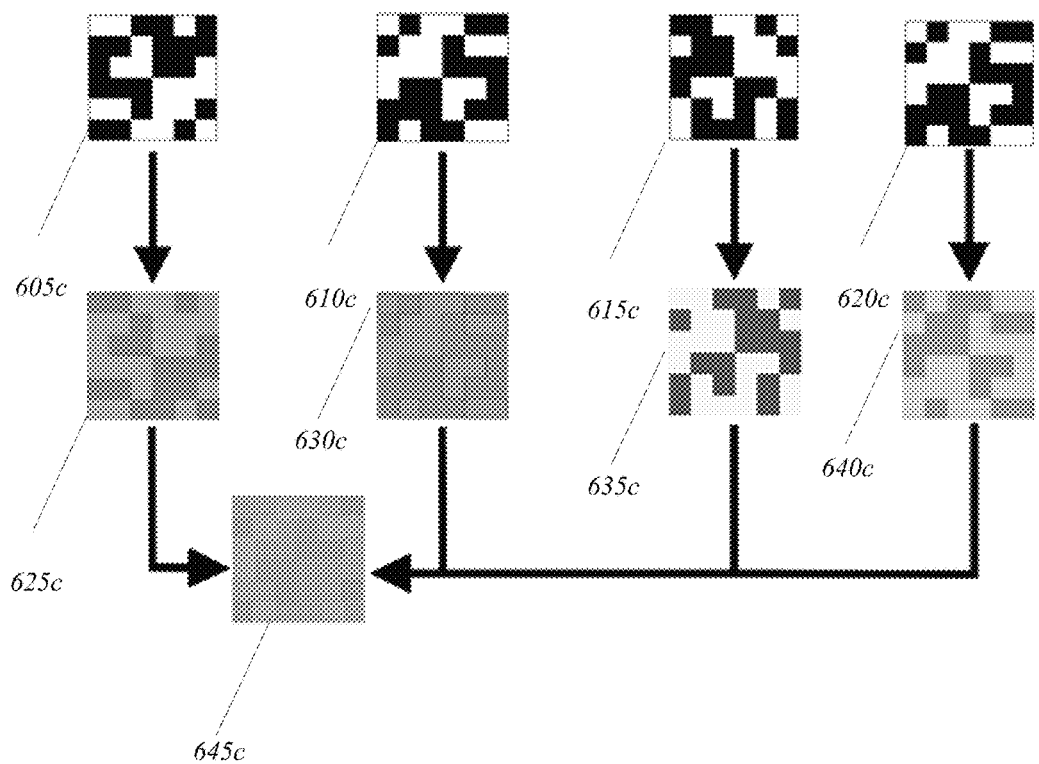
FIG. 6C illustrates formation of a scannable image in accordance with at least one embodiment of the present disclosure.

FIG. 6C illustrates one technique 600C of forming a scannable image in accordance with at least one embodiments of the present disclosure. Scannable image layers 605c, 610c, 615c, and 620c each represent a layer of a scannable image, such as a barcode, associated with one or more colors. Any suitable component as disclosed herein may perform one or more colorspace transformation techniques on each scannable image layers 605c, 610c, 615c, and 620c in order to produce layers 625c, 630c, 635c and 640c, and layers 625c, 630c, 635c and 640c may be consolidated into a single scannable image, e.g., barcode, 645c. In various embodiments, the scannable layers 625c, 630c, 635c and 640c may each be associated with a color-channel that represents one or more colors that are absent and/or not prevalent in relation to a target that may be associated with the scannable image 645c, where in various embodiments one or more color-channels associated with colors of 625c, 630c, 635c and 640c may be orthogonal or perpendicular in relation to one another and with respect to colorspaces representing those colors.

In various embodiments, at least one layer, e.g. 635c, can be made with infrared ink or generated using infrared light such that it contains an additional channel of information, e.g., an ultraviolet layer of information, which can absorb, reflect, project, and/or illuminate infrared light, where in various embodiments the infrared layer 630c may be the first layer of image 635c. In various embodiments, the infrared layer 630c may contain a color-channel layer representing various colors, including colors that are not prevalent and/or absent from a target to be associated with the scannable image 645c, and in various embodiments, only an infrared channel may be associated with the infrared layer 630d. In various embodiments, at least one layer, e.g. 640c, can be made with ultraviolet ink or generated using ultraviolet light such that it contains an additional channel of information, e.g., an ultraviolet layer of information, which can absorb, reflect, project, and/or illuminate ultraviolet light, where in various embodiments the ultraviolet layer 640c may be the first layer of image 645c. In various embodiments, the ultraviolet layer 640c may contain a color-channel layer representing various colors, including colors that are not prevalent and/or absent from a target to be associated with the scannable image 645c, and in various embodiments, only an ultraviolet channel may be associated with the ultraviolet layer 640c.

In various embodiments, the scannable image 645c is a fiducial marker that takes advantage of the inherent orienting features of ultraviolet and/or infrared light when being scanned by a suitable device that can detect either one or both of ultraviolet and/or infrared light. In various embodiments, when a suitable device, e.g., scanning device 197, scans a fiducial marker 645c that reflects both ultraviolet and infrared light, the spatial relationship of the object associated with the fiducial maker 645c, e.g. an object with the fiducial marker labeled thereon and/or a computer display generating the fiducial marker 645c, in relation to the scanning device 197 and other objects in an environment containing the device is easier to ascertain or detect because of the inherent properties associated with the reflection and detection of ultraviolet and/or infrared light. In various embodiments, where fiducial marker 645c utilizes both ultraviolet and infrared light, the presence of both operates as a fail-safe if the functionality of the scanning device 197 is compromised, and/or if an initial scan fails to detect one or the other.

In various embodiments, the scannable image 645c may include both an infrared layer 635c and an ultraviolet layer 640c, where the printing or generating of layer 645c may be such that the ultraviolet layer 640c may be the first layer in order to take advantage of the characteristics associated with ultraviolet light. Although at least one embodiment provided above indicates that either one or both of layers 635c and 640c can include color-channel information, e.g., scannable colors that have a relationship with a target, in various embodiments, layers 635c and 640c can be associated strictly with infrared and/or ultraviolet information respectively. Moreover, in various embodiments, the colors of layer 620c, 625c, and 630c do not have to be layer that has a relationship with the target, and in various embodiments, said layers can be composed of black and white colors and/or other colors unrelated to the target and/or not based on colorspace conversion techniques.

FIG. 7 illustrates a computer or tablet system 700 for generating and scanning a scannable image 740. The tablet system includes a tablet 702 for generating a scannable image 740, e.g., barcode, where the tablet 702 includes applications 705A-E, application N, and application 420, where one embodiment of application 420 is described in greater detail above with respect to FIG. 4. The tablet 702 may include one or more user interface devices 720 which a user can use to interface with the tablet 702. The tablet 702 can generate a scannable image 740 that includes one or both of an ultraviolet and infrared layer. The tablet 702 can be configured to ensure that the top layer is an ultraviolet layer to take advantage of the properties inherent with ultraviolet light. The image can further include one or more colors layer, including white and black layers. The image can further include one or more non-black and non-white colors layers that are related to colors associated with the environment where the tablet is located, e.g., the tablet can be configured to have a camera with an application, e.g., 420, that can scan an environment and produce a scannable image 740 with colors related to that environment. In various embodiments, the colors related to the environment can be colors based on one or more colorspace transformation techniques as discussed herein, including colors that are least prevalent and/or absent from the environment containing the tablet 702 and determined by one or more colorspace conversions.

The system 700 can further include a camera or scanning device c750 that can scan the scannable image 740, wherein various embodiments the camera or scanning device c750 may include application 420 (as discussed above), and/or a colorspace key and/or infrared verification bit and/or ultraviolet verification bit as disclosed herein, and in order to perform a valid scan of scannable image 740 and/or obtain any encoded information associated therewith.

Figure 8:
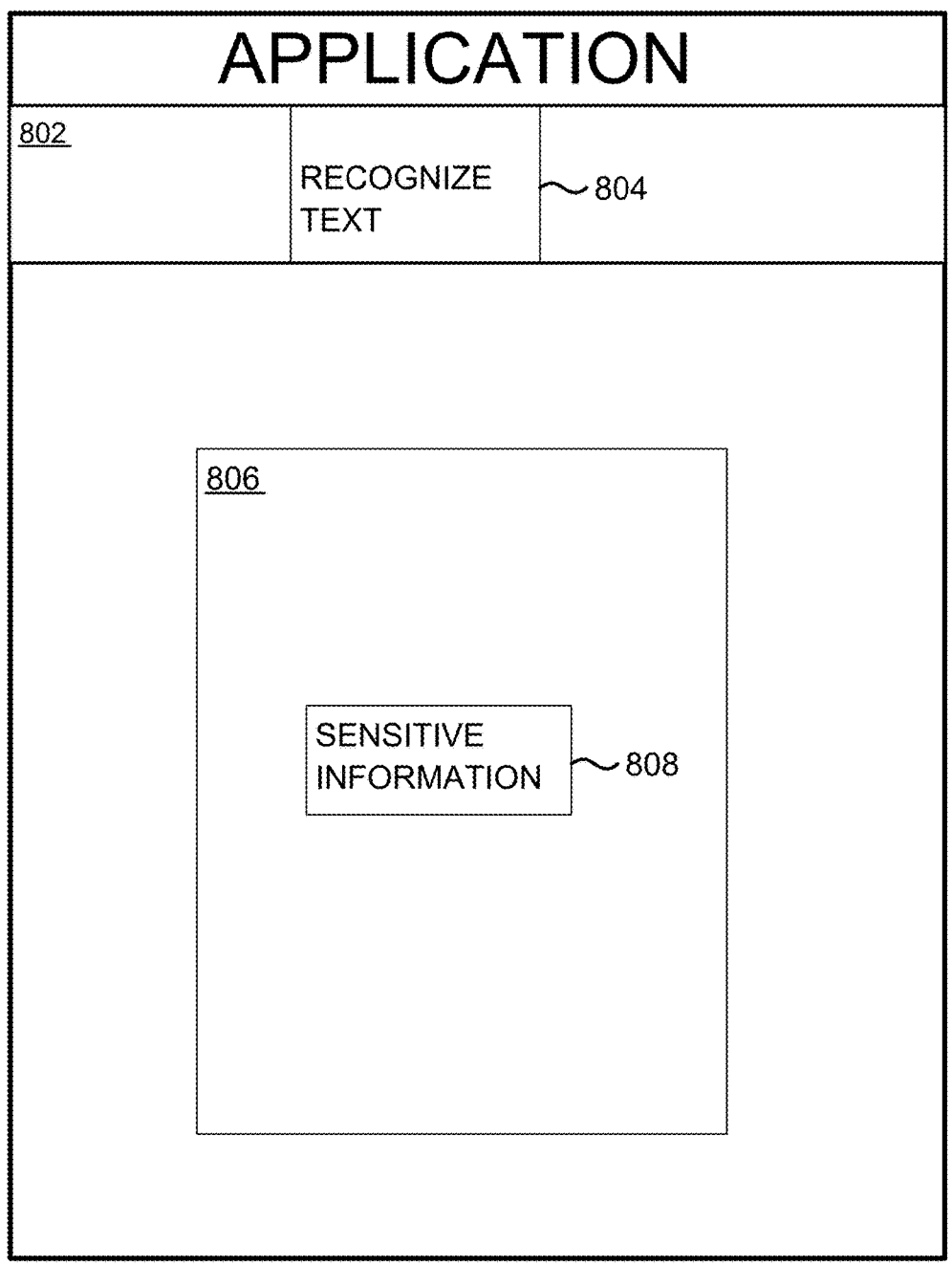
FIG. 8 illustrates an embodiment of a graphical user interface (GUI) for the system of FIG. 1.

FIG. 8 illustrates an embodiment of a graphical user interface (GUI) 800 for an application of the system 100. In some embodiments, the user interface 800 is configured for the application 420 of FIG. 4.

The GUI 800, as illustrated in FIG. 8, includes several components, such as a toolbar 802 and GUI elements. The toolbar 802 includes, as one example tool, a recognize text tool 804 that, when invoked, scans an image 806, e.g., a barcode generated from one or more colorspace techniques and/or containing one or both of an ultraviolet layer and/or infrared layer as outlined herein. The scan can be using a key and/or verification bit in order for a valid scan to take place, where a proper scan may operate as a security measure to access and/or identify sensitive information 808. As described herein, the appropriate colorspace transform mechanism provides the most accurate edge detection results because an underlying colorspace model has a higher likelihood at edge detection than any other applicable colorspace model, and the barcode can be generated with this in mind.

Figure 9:
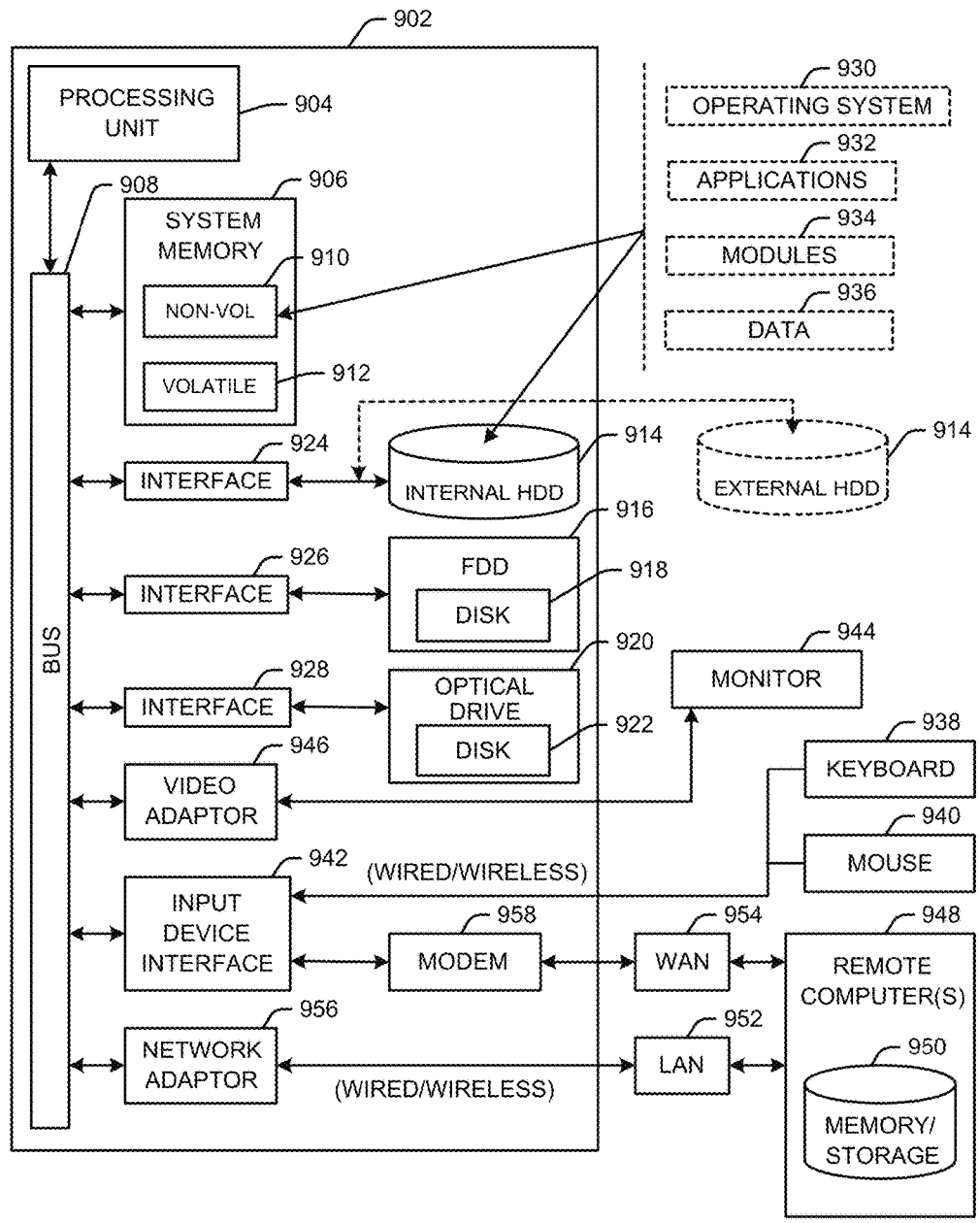
FIG. 9 illustrates an embodiment of a computing architecture.

FIG. 9 illustrates an embodiment of an exemplary computing architecture 900 suitable for implementing various embodiments as previously described. In one embodiment, the computing architecture 900 may comprise or be implemented as part of an electronic device. Examples of an electronic device may include those described with reference to FIG. 3, among others. The embodiments are not limited in this context.

As used in this application, the terms "system" and "component" are intended to refer to a computer-related entity, either hardware, a combination of hardware and software, software, or software in execution, examples of which are provided by the exemplary computing architecture 900. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 900 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 900.

As shown in FIG. 9, the computing architecture 900 comprises a processing unit 904, a system memory 906 and a system bus 908. The processing unit 904 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 904.

The system bus 908 provides an interface for system components including, but not limited to, the system memory 906 to the processing unit 904. The system bus 908 can be any of several types of bus structure that may further interconnect to a memory bus (with or without a memory controller), a peripheral bus, and a local bus using any of a variety of commercially available bus architectures. Interface adapters may connect to the system bus 908 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The computing architecture 900 may comprise or implement various articles of manufacture. An article of manufacture may comprise a computer-readable storage medium to store logic. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like. Embodiments may also be at least partly implemented as instructions contained in or on a non-transitory computer-readable medium, which may be read and executed by one or more processors to enable performance of the operations described herein.

The system memory 906 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 9, the system memory 906 can include non-volatile memory 910 and/or volatile memory 912. A basic input/output system (BIOS) can be stored in the non-volatile memory 910.

The computer 902 may include various types of computer-readable storage media in the form of one or more lower speed memory units, including an internal (or external) hard disk drive (HDD) 914, a magnetic floppy disk drive (FDD) 916 to read from or write to a removable magnetic disk 918, and an optical disk drive 920 to read from or write to a removable optical disk 922 (e.g., a CD-ROM or DVD). The HDD 914, FDD 916 and optical disk drive 920 can be connected to the system bus 908 by a HDD interface 924, an FDD interface 926 and an optical drive interface 928, respectively. The HDD interface 924 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 910, 912, including an operating system 930, one or more application programs 932, other program modules 934, and program data 936. In one embodiment, the one or more application programs 932, other program modules 934, and program data 936 can include, for example, the various applications and/or components of the system 100.

A user can enter commands and information into the computer 902 through one or more wire/wireless input devices, for example, a keyboard 938 and a pointing device, such as a mouse 940. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 904 through an input device interface 942 that is coupled to the system bus 908, but can be connected by other interfaces such as a parallel port, IEEE 1394 serial port, a game port, a USB port, an IR interface, and so forth.

A monitor 944 or other type of display device is also connected to the system bus 908 via an interface, such as a video adaptor 946. The monitor 944 may be internal or external to the computer 902. In addition to the monitor 944, a computer typically includes other peripheral output devices, such as speakers, printers, and so forth.

The computer 902 may operate in a networked environment using logical connections via wire and/or wireless communications to one or more remote computers, such as a remote computer 948. The remote computer 948 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 950 is illustrated. The logical connections depicted include wire/wireless connectivity to a local area network (LAN) 952 and/or larger networks, for example, a wide area network (WAN) 954. Such LAN and WAN networking environments are commonplace in offices and companies, and facilitate enterprise-wide computer networks, such as intranets, all of which may connect to a global communications network, for example, the Internet.

When used in a LAN networking environment, the computer 902 is connected to the LAN 952 through a wire and/or wireless communication network interface or adaptor 956. The adaptor 956 can facilitate wire and/or wireless communications to the LAN 952, which may also include a wireless access point disposed thereon for communicating with the wireless functionality of the adaptor 956.

When used in a WAN networking environment, the computer 902 can include a modem 958, or is connected to a communications server on the WAN 954, or has other means for establishing communications over the WAN 954, such as by way of the Internet. The modem 958, which can be internal or external and a wire and/or wireless device, connects to the system bus 908 via the input device interface 942. In a networked environment, program modules depicted relative to the computer 902, or portions thereof, can be stored in the remote memory/storage device 950. It may be appreciated that the network connections shown are exemplary and other means of establishing a communications link between the computers can be used.

The computer 902 is operable to communicate with wire and wireless devices or entities using the IEEE 802 family of standards, such as wireless devices operatively disposed in wireless communication (e.g., IEEE 802.11 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Figure 10:
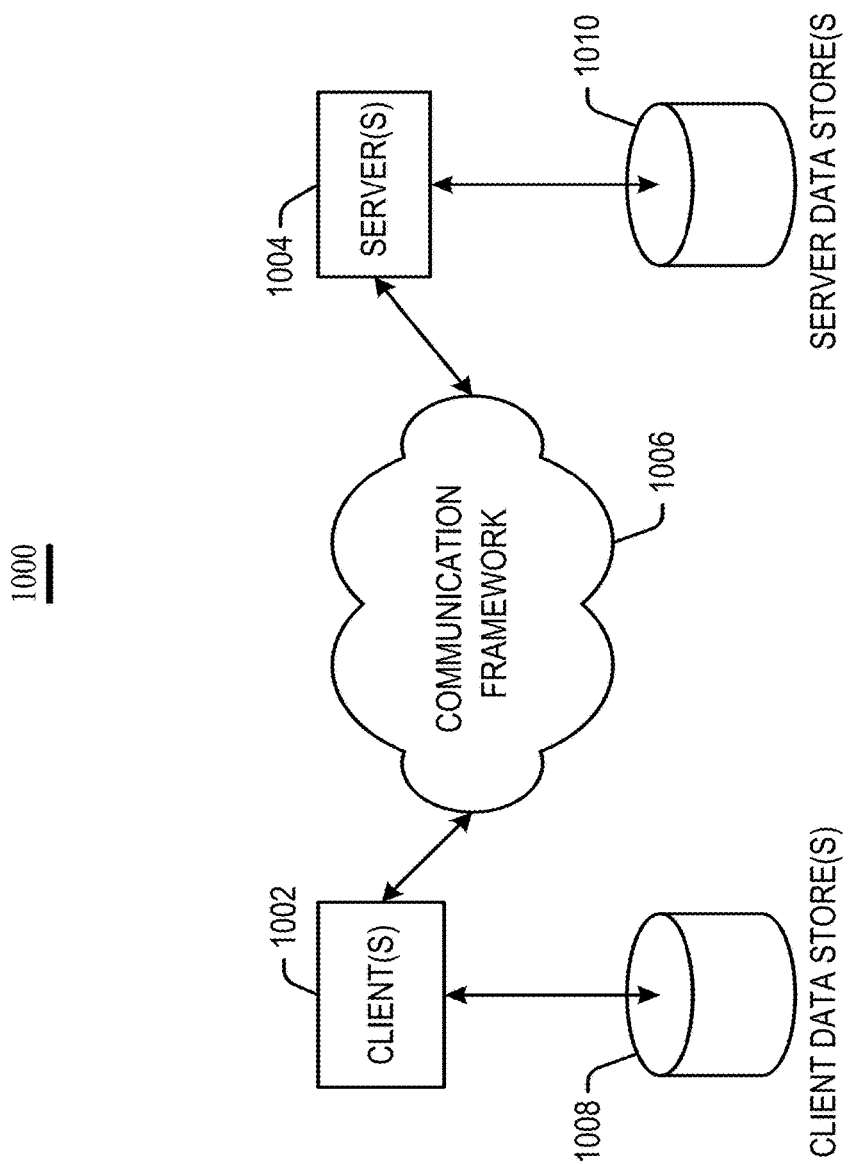
FIG. 10 illustrates an embodiment of a communications architecture.

FIG. 10 illustrates a block diagram of an exemplary communications architecture 1000 suitable for implementing various embodiments as previously described. The communications architecture 1000 includes various common communications elements, such as a transmitter, receiver, transceiver, radio, network interface, baseband processor, antenna, amplifiers, filters, power supplies, and so forth. The embodiments, however, are not limited to implementation by the communications architecture 1000.

As shown in FIG. 10, the communications architecture 1000 comprises includes one or more clients 1002 and servers 1004. The clients 1002 may implement the client device 310. The servers 1004 may implement the server device 950. The clients 1002 and the servers 1004 are operatively connected to one or more respective client data stores 1008 and server data stores 1010 that can be employed to store information local to the respective clients 1002 and servers 1004, such as cookies and/or associated contextual information.

The clients 1002 and the servers 1004 may communicate information between each other using a communication framework 1006. The communications framework 1006 may implement any well-known communications techniques and protocols. The communications framework 1006 may be implemented as a packet-switched network (e.g., public networks such as the Internet, private networks such as an enterprise intranet, and so forth), a circuit-switched network (e.g., the public switched telephone network), or a combination of a packet-switched network and a circuit-switched network (with suitable gateways and translators).

The communications framework 1006 may implement various network interfaces arranged to accept, communicate, and connect to a communications network. A network interface may be regarded as a specialized form of an input output interface. Network interfaces may employ connection protocols including without limitation direct connect, Ethernet (e.g., thick, thin, twisted pair 10/100/1000 Base T, and the like), token ring, wireless network interfaces, cellular network interfaces, IEEE 802.11a-x network interfaces, IEEE 802.16 network interfaces, IEEE 802.20 network interfaces, and the like. Further, multiple network interfaces may be used to engage with various communications network types. For example, multiple network interfaces may be employed to allow for the communication over broadcast, multicast, and unicast networks. Should processing requirements dictate a greater amount speed and capacity, distributed network controller architectures may similarly be employed to pool, load balance, and otherwise increase the communicative bandwidth required by clients 1002 and the servers 1004. A communications network may be any one and the combination of wired and/or wireless networks including without limitation a direct interconnection, a secured custom connection, a private network (e.g., an enterprise intranet), a public network (e.g., the Internet), a Personal Area Network (PAN), a Local Area Network (LAN), a Metropolitan Area Network (MAN), an Operating Missions as Nodes on the Internet (OMNI), a Wide Area Network (WAN), a wireless network, a cellular network, and other communications networks.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to allow a reader to quickly ascertain the nature of the technical disclosure. It is submitted with the understanding that it may not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The invention claimed is:

1. An apparatus, comprising:
   a memory to store instructions; and
   processing circuitry, coupled with the memory, operable to execute the instructions, that when executed, cause the processing circuitry to:
      receive a representative dataset containing at least one of i) one or more images and ii) one or more videos of a target, the target including at least one of i) an environment, ii) a live entity or iii) an object;
      process the representative dataset to create a histogram of the target;
      identify a most prevalent plurality of colors associated with the target based on the histogram by mapping the most prevalent plurality of colors according to a colorspace, wherein the colorspace is converted to another colorspace;
      determine a related plurality of colors based on the histogram by determining at least one set of color coordinates for each one of the most prevalent plurality of colors according to the another colorspace and determining at least one set of color coordinates corresponding to the related plurality of colors according to the another colorspace, wherein the related plurality of colors include at least one of i) an absent color in relation to the target or ii) a least prevalent color associated with the target; and
      create a matrix using the related plurality of colors and at least one ultraviolet layer, wherein the matrix is associated with the target.

2. The apparatus of claim 1, wherein the target is an environment, wherein the matrix is a matrix barcode located in the environment.

3. The apparatus of claim 2, wherein the at least one ultraviolet layer is a top most layer of the matrix barcode.

4. The apparatus of claim 3, wherein the process circuitry configured to identify the most prevalent plurality of colors comprises utilizing a tristimulus color system pursuant to an RGB colorspace.

5. The apparatus of claim 4, wherein the process circuitry configured to determine the related plurality of colors based on the histogram comprises filtering out at least one luminance channel to obtain either one or both of i) the least one set of color coordinates for each one of the most prevalent plurality of colors according to the another colorspace or ii) the at least one set of color coordinates corresponding to the related plurality of colors according to the another colorspace.

6. The apparatus of claim 5, wherein the matrix barcode is embedded with computer data, wherein the computer data is represented by a plurality of pixels associated in part with each of i) the at least one ultraviolet layer or ii) the related plurality of colors.

7. The apparatus of claim 6, wherein the matrix barcode is a fiducial marker for conveying spatial information to at least one of: i) a computer system, ii) a vehicle, or iii) an individual, wherein the conveyed spatial information stems at least in part from the at least one ultraviolet layer.

* * * * *